United States Patent
Uematsu et al.

(10) Patent No.: US 10,061,195 B2
(45) Date of Patent: Aug. 28, 2018

(54) PHOTOSENSITIVE RESIN COMPOSITION FOR DRY ETCHING, AND METHOD FOR PRODUCING RESIST PATTERN FOR DRY ETCHING

(71) Applicant: TOKYO OHKA KOGYO CO., LTD., Kawasaki-shi (JP)

(72) Inventors: Teruhiro Uematsu, Kawasaki (JP); Kiminori Oshio, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 99 days.

(21) Appl. No.: 15/085,488

(22) Filed: Mar. 30, 2016

(65) Prior Publication Data

US 2016/0291475 A1    Oct. 6, 2016

(30) Foreign Application Priority Data

Mar. 31, 2015  (JP) ................. 2015-071551

(51) Int. Cl.
| | | |
|---|---|---|
| G03F 7/30 | (2006.01) |
| G03F 7/028 | (2006.01) |
| G03F 7/32 | (2006.01) |
| G03F 7/032 | (2006.01) |
| G03F 7/033 | (2006.01) |

(52) U.S. Cl.
CPC .............. *G03F 7/028* (2013.01); *G03F 7/033* (2013.01); *G03F 7/0325* (2013.01); *G03F 7/30* (2013.01); *G03F 7/32* (2013.01)

(58) Field of Classification Search
CPC ........................................................ G03F 7/30
See application file for complete search history.

(56) References Cited

U.S. PATENT DOCUMENTS

| | | | | |
|---|---|---|---|---|
| 2006/0008729 | A1* | 1/2006 | Ichikawa | ................ G03F 7/202 430/270.1 |
| 2007/0087645 | A1* | 4/2007 | Tsujii | .................. H01L 51/0005 445/24 |
| 2008/0299295 | A1* | 12/2008 | Kawakami | ............... B41N 1/06 427/66 |
| 2009/0075208 | A1* | 3/2009 | Sonokawa | ............... B41N 3/08 430/302 |
| 2011/0174179 | A1* | 7/2011 | Shimono | ............... B41C 1/1008 101/453 |

FOREIGN PATENT DOCUMENTS

JP    2001-093816    4/2001

* cited by examiner

*Primary Examiner* — Kathleen Duda
(74) *Attorney, Agent, or Firm* — Knobbe Martens Olson & Bear LLP

(57) ABSTRACT

A photosensitive resin composition for dry etching including a water-soluble resin, a photopolymerizable monomer, and a photopolymerization initiator, and a method for producing a resist pattern for dry etching. The method includes forming a resin layer with the photosensitive resin composition on a substrate; exposing the resin layer with positional selectivity; and developing the exposed resin layer with water at a temperature less than 50° C., so as to form a resist pattern.

5 Claims, No Drawings

PHOTOSENSITIVE RESIN COMPOSITION FOR DRY ETCHING, AND METHOD FOR PRODUCING RESIST PATTERN FOR DRY ETCHING

CROSS-REFERENCE TO RELATED APPLICATIONS

Priority is claimed on Japanese Patent Application No. 2015-071551, filed Mar. 31, 2015, the content of which is incorporated herein by reference.

BACKGROUND OF THE INVENTION

Field of the Invention

The present invention relates to a photosensitive resin composition for dry etching, and a method for producing a resist pattern for dry etching using the same.

Background Art

According to the increasing demand of high performance, high functionality and low power consumption of semiconductor devices, the circuit patterns thereof are becoming finer. The fine circuit pattern can be produced by dry etching a semiconductor substrate with a resist pattern used as a mask. Therefore, the resist pattern is demanded to have excellent dry etching resistance. For example, Japanese Unexamined Patent Application, Publication No. 2001-093816 discloses a method for forming a resist pattern enhanced in dry etching resistance, by using a photosensitive resin composition containing a novolak resin.

In the ordinary method for producing a resist pattern for dry etching, using a photosensitive resin composition, an alkali and/or an organic solvent is used for development and stripping of the resist pattern. However, there is a recent demand of avoiding the use of deleterious or toxic substances and dangerous substance from the standpoint of safety, reduction of environmental load, and the like, it is desired to perform the development and stripping of the resist pattern without the use of an alkali and an organic solvent.

Furthermore, for ensuring a wide variety of options for the stripping method, the resist pattern is demanded to be capable of being stripped not only with a stripping solution, but also by ashing.

SUMMARY OF THE INVENTION

The invention has been made in view of the problem, and an object thereof is to provide a photosensitive resin composition for dry etching that provides a resist pattern capable of being developed and stripped without the use of an alkali and an organic solvent, and capable of being stripped favorably with a stripping solution and by ashing, and is also to provide a method for producing a resist pattern for dry etching using the photosensitive resin composition.

The present inventors have found that the problem may be solved by a photosensitive resin composition containing a water-soluble resin, and thus the invention has been completed.

According to a first embodiment of the invention, there is provided a photosensitive resin composition for dry etching, containing (A) a water-soluble resin, (B) a photopolymerizable monomer, and (C) a photopolymerization initiator.

According to a second embodiment of the invention, there is provided a method for producing a resist pattern for dry etching, containing:

forming a resin layer with the photosensitive resin composition on a substrate;

exposing the resin layer positionally selectively; and developing the exposed resin layer with water at a temperature less than 50° C., so as to form a resist pattern.

According to the invention, a photosensitive resin composition for dry etching that provides a resist pattern capable of being developed and stripped without the use of an alkali and an organic solvent, and capable of being stripped favorably with a stripping solution and by ashing can be provided, and a method for producing a resist pattern for dry etching using the photosensitive resin composition is also provided.

DETAILED DESCRIPTION OF THE PREFERRED EMBODIMENTS

Photosensitive Resin Composition for Dry Etching

The photosensitive resin composition for dry etching according to the invention contains (A) a water-soluble resin, (B) a photopolymerizable monomer, and (C) a photopolymerization initiator. A resist pattern that is obtained from the photosensitive resin composition for dry etching according to the invention is capable of being developed and stripped without the use of an alkali and an organic solvent, and is capable of being stripped favorably with a stripping solution of by ashing.

The photosensitive resin composition for dry etching according to the invention preferably has a weight loss at 400° C. of 70% or more for enabling oxidation decomposition by an ashing treatment finally.

The photosensitive resin composition for dry etching according to the invention preferably has an etching selectivity ratio to silicon of 30% or more. The photosensitive resin composition for dry etching according to the invention is excellent in dry etching resistance due to the high etching selectivity ration thereof, and thus can be favorably applied, for example, to scribing and formation of through holes of a substrate in a post-process of a semiconductor. In the post-process of a semiconductor, deleterious or toxic substances and dangerous substance, such as an alkali and an organic solvent, are generally not used, and the photosensitive resin composition for dry etching according to the invention capable of being developed and stripped without the use of an alkali and an organic solvent can be favorably applied to these purposes. The etching selectivity ratio to silicon referred herein means a ration calculated by the following expression for the case where the etching gas is $SF_6$, $CF_4$, or $O_2$.

etching selectivity ratio=((etching rate of Si (μm/sec))/(etching rate of resin layer formed of photosensitive resin composition (μm/sec)))×100

(A) Water-Soluble Resin

The water-soluble resin (A) is not particularly limited, and ordinarily known water-soluble resins may be used. The water-soluble resin (A) may be used solely or as a combination of two or more kinds thereof.

The water-solubility referred herein means that the resin is soluble in water at 30° C. in an amount of 5 mass % or more. From the standpoint of providing the advantageous effects of the invention, the resin is preferably soluble in an amount of 10 mass % or more, and more preferably 15 mass % or more.

Examples of the water-soluble resin (A) include a cellulose polymer (i.e., a water-soluble cellulose polymer), such as hydroxypropyl methylcellulose phthalate, hydroxypropyl methylcellulose acetate phthalate, hydroxypropyl methylcellulose acetate succinate, hydroxypropyl methylcellulose hexahydrophthalate, hydroxypropyl methylcellulose, hydroxypropyl cellulose, hydroxyethyl cellulose, cellulose acetate hexahydrophthalate, carboxymethyl cellulose, ethyl cellulose, and methyl cellulose; a vinyl polymer (i.e., a water-soluble vinyl polymer), such as polyvinyl alcohol and polyvinylpyrrolidone; an acrylic acid polymer (i.e., a water-soluble acrylic acid polymer) containing as a monomer acrylamide, N,N-dimethylacrylamide, N,N-dimethylaminopropylmethacrylamide, N,N-dimethylaminopropylacrylamide, N-methylacrylamide, diacetoneacrylamide, N,N-dimethylaminoethyl methacrylate, N,N-diethylaminoethyl methacrylate, N,N-dimethylaminoethyl acrylate, acryloylmorpholine, hydroxyethyl acrylate, acrylic acid, and the like; a copolymer of vinylpyrrolidine and acrylic acid; and a copolymer of acrylamide and diacetoneacrylamide. Among these, a cellulose polymer and the like are preferably used.

In the cellulose polymer, hydroxypropyl methylcellulose phthalate, hydroxypropyl methylcellulose acetate phthalate, hydroxypropyl methylcellulose acetate succinate, hydroxypropyl methylcellulose hexahydrophthalate, hydroxypropyl methylcellulose, hydroxypropyl cellulose, and hydroxyethyl cellulose are preferably used since these compounds have high water solubility and excellent etching resistance, and are difficult to provide thermal decomposition residual materials remaining after thermal decomposition. These compounds have high water solubility due to the large amount of hydroxyl groups in the structure thereof, and have low chemical activity, and therefore, these compounds have high resistance to various etchants (particularly a non-aqueous etchant), and particularly high resistance to dry etching.

The water-soluble resin (A) preferably has a mass average molecular weight (Mw: polystyrene conversion value in gel permeation chromatography (GPC), which is the same throughout the description) of 1,000 or more and 1,000,000 or less, and more preferably 10,000 or more and 300,000 or less. When the mass average molecular weight of the water-soluble resin is in the range, the coating stability may be enhanced.

(B) Photopolymerizable Monomer

The photopolymerizable monomer (B) is not particularly limited, and ordinarily known photopolymerizable monomers may be used. The photopolymerizable monomer (B) may be used solely or as a combination of two or more kinds thereof. The photopolymerizable monomer (B) includes a monofunctional monomer and a polyfunctional monomer.

Examples of the monofunctional monomer include (meth)acrylamide, methylol(meth)acrylamide, methoxymethyl(meth)acrylamide, ethoxymethyl(meth)acrylamide, propoxymethyl(meth)acrylamide, butoxymethyl(meth)acrylamide, N-methylol(meth)acrylamide, N-hydroxymethyl (meth)acrylamide, (meth)acrylic acid, fumaric acid, maleic acid, maleic anhydride, itaconic acid, itaconic anhydride, citraconic acid, citraconic anhydride, crotonic acid, 2-acrylamido-2-methylpropanesulfonic acid, tert-butylacrylamidosulfonic acid, methyl (meth)acrylate, ethyl (meth)acrylate, butyl (meth)acrylate, 2-ethylhexyl (meth)acrylate, lauryl (meth)acrylate, cyclohexyl (meth)acrylate, 2-hydroxyethyl (meth)acrylate, 2-hydroxypropyl (meth)acrylate, 2-hydroxybutyl (meth)acrylate, 2-phenoxy-2-hydroxypropyl (meth)acrylate, 2-(meth)acryloyloxy-2-hydroxypropyl phthalate, glycerin mono(meth)acrylate, tetrahydrofurfuryl (meth)acrylate, dimethylamino (meth)acrylate, glycidyl (meth)acrylate, 2,2,2-trifluoroethyl (meth)acrylate, 2,2,3,3-tetrafluoropropyl (meth)acrylate, and a half (meth)acrylate of a phthalic acid derivative. The monofunctional monomer may be used solely or as a combination of two or more kinds thereof.

Examples of the polyfunctional monomer include ethylene glycol di(meth)acrylate, diethylene glycol di(meth)acrylate, tetraethylene glycol di(meth)acrylate, propylene glycol di(meth)acrylate, polypropylene glycol di(meth)acrylate, butylene glycol di(meth)acrylate, neopentyl glycol di(meth)acrylate, 1,6-hexane glycol di(meth)acrylate, trimethylolpropane tri(meth)acrylate, glycerin di(meth)acrylate, pentaerythritol triacrylate, pentaerythritol tetraacrylate, dipentaerythritol pentaacrylate, dipentaerythritol hexaacrylate, pentaerythritol di(meth)acrylate, pentaerythritol tri(meth)acrylate, pentaerythritol tetra(meth)acrylate, dipentaerythritol penta(meth)acrylate, dipentaerythritol hexa (meth)acrylate, 2,2-bis(4-(meth)acryloxydiethoxyphenyl)propane, 2,2-bis(4-(meth)acryloxypolyethoxyphenyl)propane, 2-hydroxy-3-(meth)acryloyloxyppropyl (meth)acrylate, ethylene glycol diglycidyl ether di(meth)acrylate, diethylene glycol diglycidyl ether di(meth)acrylate, diglycidyl phthalate di(meth)acrylate, glycerin triacrylate, glycerin polyglycidyl ether poly(meth)acrylate, urethane (meth)acrylate (i.e., tolylene diisocyanate), a reaction product of trimethylhexamethylene diisocyanate, hexamethylene diisocyanate and 2-hydroxyethyl (meth)acrylate, methylene bis (meth)acrylamide, (meth)acrylamide methylene ether, a condensate of a polyhydric alcohol and N-methylol(meth)acrylamide, and triacrylformal. The polyfunctional monomer may be used solely or as a combination of two or more kinds thereof.

The content of the photopolymerizable monomer (B) is preferably from 5 to 150 parts by mass, and more preferably from 10 to 100 parts by mass, per 100 parts by mass of the water-soluble resin (A). When the content of the photopolymerizable monomer (B) is in the range, there is a tendency that the sensitivity, the developing property and the resolution property may be well balanced.

(C) Photopolymerization Initiator

The photopolymerization initiator (C) is not particularly limited, and ordinarily known photopolymerization initiators may be used. The photopolymerization initiator (C) may be used solely or as a combination of two or more kinds thereof.

Specific examples of the photopolymerization initiator (C) include 1-hydroxycyclohexyl phenyl ketone, 2-hydroxy-2-methyl-1-phenylpropan-1-one, 1-(4-(2-hydroxyethoxy)phenyl)-2-hydroxy-2-methyl-1-propan-1-one, 1-(4-isopropylphenyl)-2-hydroxy-2-methylpropan-1-one, 1-(4-dodecylphenyl)-2-hydroxy-2-methylpropan-1-one, bis(4-dimethylaminophenyl) ketone, 2,4,6-trimethylbenzoyldiphenylphosphine oxide, 4-benzoyl-4'-methyldimethylsulfide, 4-dimethylaminobenzoic acid, methyl 4-dimethylaminobenzoate, ethyl 4-dimethylaminobenzoate, butyl 4-dimethylaminobenzoate, 4-dimethylamino-2-ethylhexylbenzoic acid, 4-dimethylamino-2-isoamylbenzoic acid, benzyl-β-methoxyethylacetal, benzyl dimethyl ketal, 1-phenyl-1,2-propanedione-2-(o-ethoxycarbonyl)oxime, methyl o-benzoylbenzoate, 2,4-diethylthioxanthone, 2-chlorothioxanthone, 2,4-dimethylthioxanthone, 1-chloro-4-propoxythioxanthone, thioxanthene, 2-chlorothioxanthene, 2,4-diethylthioxanthene, 2-methylthioxanthene, 2-isopropylthioxanthene, 2-ethylanthraquinone, octamethylanthraquinone, 1,2-benzanthraquinone, 2,3-diphenylanthraquinone, azobisisobutyronitrile, benzoyl peroxide, cumene peroxide, 2-mercaptobenzimidazole, 2-mercaptobenzoxazole, 2-mercaptobenzothiazole, 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4,5-triarylimidazole dimer, benzophenone, 2-chlorobenzophenone, 4,4'-bisdimethylaminobenzophenone (i.e., Michler's ketone), 4,4'-bisdiethylaminobenzophenone (i.e., ethyl Michler's ketone), 4,4'-dichlorobenzophenone, 3,3-dimethyl-4-methoxybenzophenone, benzyl, benzoin, benzoin methyl ether, benzoin ethyl ether, benzoin isopropyl ether, benzoin n-butyl ether, benzoin isobutyl ether, benzoin butyl ether, acetophenone, 2,2-diethoxyacetophenone, p-dimethylacetophenone, p-dimethylaminopropiophenone, dichloroacetophenone, trichloroacetophenone, p-tert-butylacetophenone, p-dimethylaminoacetophenone, p-tert-butyltrichloroacetophenone, p-tert-butyldichloroacetophenone, α,α-dichloro-4-phenoxyacetophenone, thioxanthone, 2-methylthioxanthone, 2-isopropylthioxanthone, dibenzosuberone, pentyl 4-dimethylaminobenzoate, 9-phenylacridine, 1,7-bis-(9-acridinyl)heptane, 1,5-bis(9-acridinyl)pentane, 1,3-bis(9-acridinyl)propane, p-methoxytriazine, 2,4,6-tris(trichloromethyl)-s-triazine, 2-methyl-4,6-bis(trichloromethyl)-s-triazine, 2-(2-(5-methylfuran-2-yl)ethenyl)-4,6-bis(trichloromethyl)-s-triazine, 2-(2-(furan-2-yl)ethenyl)-4,6-bis(trichloromethyl)-s-triazine, 2-(2-(4-diethylamino-2-methylphenyl)ethenyl)4,6-bis(trichloromethyl)-s-triazine, 2-(2-(3,4-dimethoxyphenyl)ethenyl)-4,6-bis(trichloromethyl)-s-triazine, 2-(4-methoxyphenyl)-4,6-bis(trichloromethyl)-s-triazine, 2-(4-ethoxystylyl)-4,6-bis(trichloromethyl)-s-triazine, 2-(4-n-butoxyphenyl)-4,6-bis(trichloromethyl)-s-triazine, 2,4-bistrichloromethyl-6-(3-bromo-4-methoxy)phenyl-s-triazine, 2,4-bistrichloromethyl-6-(2-bromo-4-methoxy)phenyl-s-triazine, 2,4-bistrichloromethyl-6-(3-bromo-4-methoxy)styrylphenyl-s-triazine, 2,4-bistrichloromethyl-6-(2-bromo-4-methoxy)styrylphenyl-s-triazine, IRGACURE OXE02, IRGACURE OXE01, IRGACURE 369, IRGACURE 651 and IRGACURE 907, trade names, available from BASF AG, and NCI-831, a trade name, available from ADEKA Corporation.

The photosensitive resin composition preferably contains an oxime ester compound as the photopolymerization initiator (C) among the aforementioned compounds. An oxime ester compound contains two organic groups that are bonded through an oxime ester bond represented by =N—O—CO—. In the case where an oxime ester compound is mixed as the photopolymerization initiator (C) in the photosensitive resin composition, the photosensitive resin composition that is excellent in exposure sensitivity may be obtained.

The oxime ester compound used as the photopolymerization initiator (C) is not particularly limited, and ordinarily known compounds may be used. In the oxime ester compound, a compound represented by the following formula (c1) is preferred.

[Chemical formula 1]

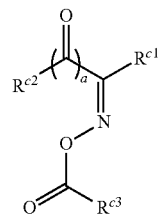

(c1)

In the general formula (c1), $R^{c1}$ represents an alkyl group having 1 to 10 carbon atoms, which may have a substituent, a phenyl group, which may have a substituent, or a carbazolyl group, which may have a substituent; a represents 0 or 1; $R^{c2}$ represents an alkyl group having 1 to 10 carbon atoms, which may have a substituent, a phenyl group, which may have a substituent, or a carbazolyl group, which may have a substituent; and $R^{c3}$ represents a hydrogen atom, an alkyl group having 1 to 6 carbon atoms, or a phenyl group, which may have a substituent.

In the case where $R^{c1}$ represents an alkyl group having 1 to 10 carbon atoms, which may have a substituent, the kind of the substituent of the alkyl group is not particularly limited as far as the objects of the invention are not impaired. Examples of the substituent of the alkyl group having 1 to 10 carbon atoms include an alkoxy group having 1 to 20 carbon atoms, a cycloalkyl group having 3 to 10 carbon atoms, a cycloalkoxy group having 3 to 10 carbon atoms, a saturated aliphatic acyl group having 2 to 20 carbon atoms, an alkoxycarbonyl group having 2 to 20 carbon atoms, a saturated aliphatic acyloxy group having 2 to 20 carbon atoms, a phenyl group, which may have a substituent, a phenoxy group, which may have a substituent, a phenylthio group, which may have a substituent, a benzoyl group, which may have a substituent, a phenoxycarbonyl group, which may have a substituent, a benzoyloxy group, which may have a substituent, a phenylalkyl group having 7 to 20 carbon atoms, which may have a substituent, a naphthyl group, which may have a substituent, a naphthoxy group, which may have a substituent, a naphthoyl group, which may have a substituent, a naphthoxycarbonyl group, which may have a substituent, a naphthoyloxy group, which may have a substituent, a naphthylalkyl group having 11 to 20 carbon atoms, which may have a substituent, a heterocyclyl group, which may have a substituent, a heterocyclylcarbonyl group, which may have a substituent, an amino group, an amino group substituted by one or two organic groups, a morpholin-1-yl group, a piperazin-1-yl group, a halogen atom, a nitro group, and a cyano group.

The alkyl group having 1 to 10 carbon atoms may be a linear chain or a branched chain. In this case, the number of carbon atoms of the alkyl group is preferably 1 to 8, and more preferably 1 to 5.

In the case where $R^{c1}$ represents a phenyl group, which may have a substituent, the kind of the substituent of the phenyl group is not particularly limited as far as the objects of the invention are not impaired. Preferred examples of the substituent of the phenyl group include an alkyl group, an alkoxy group, a cycloalkyl group, a cycloalkoxy group, a saturated aliphatic acyl group, an alkoxycarbonyl group, a saturated aliphatic acyloxy group, a phenyl group, which may have a substituent, a phenoxy group, which may have a substituent, a benzoyl group, which may have a substituent, a phenoxycarbonyl group, which may have a substituent, a benzoyloxy group, which may have a substituent, a phenylalkyl group, which may have a substituent, a naphthyl group, which may have a substituent, a naphthoxy group, which may have a substituent, a naphthoyl group, which may have a substituent, a naphthoxycarbonyl group, which may have a substituent, a naphthoyloxy group, which may have a substituent, a naphthylalkyl group, which may have a substituent, a heterocyclyl group, which may have a substituent, an amino group, an amino group substituted by one or two organic groups, a morpholin-1-yl group, a piperazin-1-yl group, a halogen atom, a nitro group, and a cyano group. In the case where $R^{c1}$ represents a phenyl group, which may have a substituent, and the phenyl group has plural substituents, the plural substituents may be the same as or different from each other.

In the case where the substituent of the phenyl group is an alkyl group, the number of carbon atoms thereof is preferably 1 to 20, more preferably 1 to 10, further preferably 1 to 6, particularly preferably 1 to 3, and most preferably 1. The alkyl group may be a linear chain or a branched chain. In the case where the substituent of the phenyl group is an alkyl group, specific examples of the alkyl group include a methyl group, an ethyl group, a n-propyl group, an isopropyl group, a n-butyl group, an isobutyl group, a sec-butyl group, a tert-butyl group, a n-pentyl group, an isopentyl group, a sec-pentyl group, a tert-pentyl group, a n-hexyl group, a n-heptyl group, a n-octyl group, an isooctyl group, a sec-octyl group, a tert-octyl group, a n-nonyl group, an isononyl group, a n-decyl group, and an isodecyl group. The alkyl group may contain an ether bond (—O—) in the carbon chain thereof. In this case, examples of the substituent of the phenyl group include an alkoxyalkyl group and an alkoxyalkoxyalkyl group. In the case where the substituent of the phenyl group is an alkoxyalkyl group, a group represented by —$R^{c4}$—O—$R^{c5}$ is preferred. $R^{c4}$ represents an alkylene group having 1 to 10 carbon atoms, which may be a linear chain or a branched chain. $R^{c5}$ represents an alkyl group having 1 to 10 carbon atoms, which may be a linear chain or a branched chain. The number of carbon atoms of $R^{c4}$ is preferably 1 to 8, more preferably 1 to 5, and particularly preferably 1 to 3. The number of carbon atoms of $R^{c5}$ is preferably 1 to 8, more preferably 1 to 5, particularly preferably 1 to 3, and most preferably 1. Examples of the alkyl group having an ether bond in the carbon chain include a methoxyethyl group, an ethoxyethyl group, a methoxyethoxyethyl group, an ethoxyethoxyethyl group, a propyloxyethoxyethyl group, and methoxypropyl group.

In the case where the substituent of the phenyl group is an alkoxy group, the number of carbon atoms thereof is preferably 1 to 20, and more preferably 1 to 6. The alkoxy group may be a linear chain or a branched chain. In the case where the substituent of the phenyl group is an alkoxy group, specific examples of the alkoxy group include a methoxy group, an ethoxy group, a n-propyloxy group, an isopropyloxy group, a n-butyloxy group, an isobutyloxy group, a sec-butyloxy group, a tert-butyloxy group, a n-pentyloxy group, an isopentyloxy group, a sec-pentyloxy group, a tert-pentyloxy group, a n-hexyloxy group, a n-heptyloxy group, a n-octyloxy group, an isooctyloxy group, a sec-octyloxy group, a tert-octyloxy group, a n-nonyloxy group, an isononyloxy group, a n-decyloxy group, and an isodecyloxy group. The alkoxy group may contain an ether bond (—O—) in the carbon chain thereof. Examples of the alkoxy group having an ether bond in the carbon chain include a methoxyethoxy group, an ethoxyethoxy group, a 2-methoxy-1-methylethoxy group, a methoxyethoxyethoxy group, an ethoxyethoxyethoxy group, a propyloxyethoxyethoxy group, and a methoxypropyloxy group.

In the case where the substituent of the phenyl group is a cycloalkyl group or a cycloalkoxy group, the number of carbon atoms thereof is preferably 3 to 10, and more preferably 3 to 6. In the case where the substituent of the phenyl group is a cycloalkoxy group, specific examples of the cycloalkyl group include a cyclopropyl group, a cyclobutyl group, a cyclopentyl group, a cyclohexyl group, a cycloheptyl group, and a cyclooctyl group. In the case where the substituent of the phenyl group is a cycloalkoxy group, specific examples of the cycloalkoxy group include a cyclopropyloxy group, a cyclobutyloxy group, a cyclopentyloxy group, a cyclohexyloxy group, a cycloheptyloxy group, and a cyclooctyloxy group.

In the case where the substituent of the phenyl group is a saturated aliphatic acyl group or a saturated aliphatic acyloxy group, the number of carbon atoms thereof is preferably 2 to 20, and more preferably 2 to 7. In the case where the substituent of the phenyl group is a saturated aliphatic acyl group, specific examples of the saturated aliphatic acyl group include an acetyl group, a propanoyl group, a n-butanoyl group, a 2-methylpropanoyl group, a n-pentanoyl group, a 2,2-dimethylpropanoyl group, n-hexanoyl group, a n-heptanoyl group, a n-octanoyl group, n-nonanoyl group, a n-decanoyl group, a n-undecanoyl group, a n-dodecanoyl group, a n-tridecanoyl group, a n-tetradecanoyl group, a n-pentadecanoyl group, and a n-hexadecanoyl group. In the case where the substituent of the phenyl group is a saturated aliphatic acyloxy group, specific examples of the saturated aliphatic acyloxy group include an acetyloxy group, a propanoyloxy group, a n-butanoyloxy group, a 2-methylpropanoyloxy group, a n-pentanoyloxy group, a 2,2-dimethylpropanoyloxy group, n-hexanoyloxy group, a n-heptanoyloxy group, a n-octanoyloxy group, n-nonanoyloxy group, a n-decanoyloxy group, a n-undecanoyloxy group, a n-dodecanoyloxy group, a n-tridecanoyloxy group, a n-tetradecanoyloxy group, a n-pentadecanoyloxy group, and a n-hexadecanoyloxy group.

In the case where the substituent of the phenyl group is an alkoxycarbonyl group, the number of carbon atoms thereof is preferably 2 to 20, and more preferably 2 to 7. In the case where the substituent of the phenyl group is an alkoxycarbonyl group, specific examples of the alkoxycarbonyl group include a methoxycarbonyl group, an ethoxycarbonyl group, a n-propyloxycarbonyl group, an isopropyloxycarbonyl group, a n-butyloxycarbonyl group, an isobutyloxycarbonyl group, a sec-butyloxycarbonyl group, a tert-butyloxycarbonyl group, a n-pentyloxycarbonyl group, an isopentyloxycarbonyl group, a sec-pentyloxycarbonyl group, a tert-pentyloxycarbonyl group, a n-hexyloxycarbonyl group, a n-heptyloxycarbonyl group, a n-octyloxycarbonyl group, an isooctyloxycarbonyl group, a sec-octyloxycarbonyl group, a tert-octyloxycarbonyl group, a n-nonyloxycarbonyl group, an isononyloxycarbonyl group, a n-decyloxycarbonyl group, and an isodecyloxycarbonyl group.

In the case where the substituent of the phenyl group is a phenylalkyl group, the number of carbon atoms thereof is preferably 7 to 20, and more preferably from 7 to 10. In the case where the substituent of the phenyl group is a naphthylalkyl group, the number of carbon atoms thereof is preferably 11 to 20, and more preferably from 11 to 14. In the case where the substituent of the phenyl group is a phenylalkyl group, specific examples of the phenylalkyl group include a benzyl group, a 2-phenylethyl group, a 3-phenylpropyl group, and a 4-phenylbutyl group. In the case where the substituent of the phenyl group is a naphthylalkyl group, specific examples of the naphthylalkyl group include an α-naphthylmethyl group, a β-naphthylmethyl group, a 2-(α-naphthyl)ethyl group, and a 2-(β-naphthyl)ethyl group. In the case where the substituent of the phenyl group is a phenylalkyl group or a naphthylalkyl group, the substituent may further have a substituent on the phenyl group or the naphthyl group.

In the case where the substituent of the phenyl group is a heterocyclyl group, the heterocyclyl group may be a 5-membered or 6-membered monocyclic ring containing one or more of N, S, and O, or may contain the monocyclic rings condensed with each other or the monocyclic ring and a benzene ring condensed with each other. In the case where the heterocyclyl group is the condensed ring, the number of the condensed rings may be 3 or less. Examples of the heterocyclic ring constituting the heterocyclyl group include furan, thiophene, pyrrole, oxazole, isoxazole, thiazole, thiadiazole, isothiazole, imidazole, pyrazole, triazole, pyridine, pyrazine, pyrimidine, pyridazine, benzofuran, benzothiophene, indole, isoindole, indolizine, benzimidazole, benzotriazole, benzoxazole, benzothiazole, carbazole, purine, quinoline, isoquinoline, quinazoline, phthalazine, cinnoline, and quinoxaline. In the case where the substituent of the phenyl group is a heterocyclyl group, the heterocyclyl group may further have a substituent.

In the case where the substituent of the phenyl group is an amino group substituted by one or two organic groups, preferred examples of the organic group include an alkyl group having 1 to 20 carbon atoms, a cycloalkyl group having 3 to 10 carbon atoms, a saturated aliphatic acyl group having 2 to 20 carbon atoms, a saturated aliphatic acyloxy group having 2 to 20 carbon atoms, a phenyl group, which may have a substituent, a benzoyl group, which may have a substituent, a phenylalkyl group having 7 to 20 carbon atoms, which may have a substituent, a naphthyl group, which may have a substituent, a naphthoyl group, which may have a substituent, a naphthylalkyl group having 11 to 20 carbon atoms, which may have a substituent, and a heterocyclyl group. Specific examples of the preferred organic groups include the same ones as described for the substituent of the phenyl group. Specific examples of the amino group substituted by one or two organic groups include a methylamino group, an ethylamino group, a diethylamino group, a n-propylamino group, a di-n-propylamino group, an isopropylamino group, a n-butylamino group, a di-n-butylamino group, a n-pentylamino group, a n-hexylamino group, a n-heptylamino group, a n-octylamino group, a n-nonylamino group, a n-decylamino group, a phenylamino group, a naphthylamino group, an acetylamino group, a propanoylamino group, a n-butanoylamino group, a n-pentanoylamino group, a n-hexanoylamino group, a n-heptanoylamino group, a n-octanoylamino group, a n-decanoylamino group, a benzoylamino group, an α-naphthoylamino group, a β-naphthoylamino group, and an N-acetyl-N-acetyloxyamino group.

In the case where a phenyl group, a naphthyl group, or a heterocyclyl group contained in the substituent of the phenyl group further has a substituent, examples of the substituent include an alkyl group having 1 to 6 carbon atoms, an alkoxy group having 1 to 6 carbon atoms, a saturated aliphatic acyl group having 2 to 7 carbon atoms, an alkoxycarbonyl group having 2 to 7 carbon atoms, a saturated aliphatic acyloxy group having 2 to 7 carbon atoms, a monoalkylamino group having an alkyl group having 1 to 6 carbon atoms, a dialkylamino group having an alkyl group having 1 to 6 carbon atoms, a morpholin-1-yl group, a piperazin-1-yl group, a halogen atom, a nitro group, and a cyano group. In the case where the phenyl group, the naphthyl group, or the heterocyclyl group contained in the substituent of the phenyl group further has a substituent, the number of the substituent is not particularly limited within a range that does not impair the objects of the invention, and is preferably 1 to 4. In the case where the phenyl group, the naphthyl group, or the heterocyclyl group contained in the substituent of the phenyl group has plural substituents, the plural substituents may be the same as or different from each other.

The substituent in the case where $R^{c1}$ represents a phenyl group, which may have a substituent, has been described, and in the substituents, an alkyl group and an alkoxyalkyl group are preferred.

In the case where $R^{c1}$ represents a phenyl group, which may have a substituent, the number of the substituent and the bonding position of the substituent are not particularly limited within ranges that do not impair the objects of the invention. In the case where $R^{c1}$ represents a phenyl group, which may have a substituent, the phenyl group, which may have a substituent, is preferably an o-tolyl group, which may have a substituent, since an excellent base generation efficiency may be obtained.

In the case where $R^{c1}$ represents a carbazolyl group, which may have a substituent, the kind of the substituent is not particularly limited within a range that does not impair the objects of the invention. Examples of the preferred substituent of the carbazolyl group substituted on the carbon atom thereof include an alkyl group having 1 to 20 carbon atoms, an alkoxy group having 1 to 20 carbon atoms, a cycloalkyl group having 3 to 10 carbon atoms, a cycloalkoxy group having 3 to 10 carbon atoms, a saturated aliphatic acyl group having 2 to 20 carbon atoms, an alkoxycarbonyl group having 2 to 20 carbon atoms, a saturated aliphatic acyloxy group having 2 to 20 carbon atoms, a phenyl group, which may have a substituent, a phenoxy group, which may have a substituent, a phenylthio group, which may have a substituent, a phenylcarbonyl group, which may have a substituent, a benzoyl group, which may have a substituent, a phenoxycarbonyl group, which may have a substituent, a benzoyloxy group, which may have a substituent, a phenylalkyl group having 7 to 20 carbon atoms, which may have a substituent, a naphthyl group, which may have a substituent, a naphthoxy group, which may have a substituent, a naphthylcarbonyl group, which may have a substituent, a naphthoyl group, which may have a substituent, a naphthoxycarbonyl group, which may have a substituent, a naphthoyloxy group, which may have a substituent, a naphthylalkyl group having 11 to 20 carbon atoms, which may have a substituent, a heterocyclyl group, which may have a substituent, a heterocyclylcarbonyl group, which may have a substituent, an amino group, an amino group substituted by one or two organic groups, a morpholin-1-yl group, a piperazin-1-yl group, a halogen atom, a nitro group, and a cyano group.

In the case where $R^{c1}$ represents a carbazolyl group, which may have a substituent, examples of the preferred substituent of the carbazolyl group substituted on the nitrogen atom thereof include an alkyl group having 1 to 20 carbon atoms, a cycloalkyl group having 3 to 10 carbon atoms, a saturated aliphatic acyl group having 2 to 20 carbon atoms, an alkoxycarbonyl group having 2 to 20 carbon atoms, a phenyl group, which may have a substituent, a benzoyl group, which may have a substituent, a phenoxycarbonyl group, which may have a substituent, a phenylalkyl group having 7 to 20 carbon atoms, which may have a substituent, a naphthyl group, which may have a substituent, a naphthoyl group, which may have a substituent, a naphthoxycarbonyl group, which may have a substituent, a naphthylalkyl group having 11 to 20 carbon atoms, which may have a substituent, a heterocyclyl group, which may have a substituent, and a heterocyclylcarbonyl group, which may have a substituent. In the substituents, an alkyl group having 1 to 20 carbon atoms is preferred, an alkyl group having 1 to 6 carbon atoms is more preferred, and an ethyl group is particularly preferred.

Specific examples of the substituent of the carbazolyl group for an alkyl group, an alkoxy group, a cycloalkyl group, a cycloalkoxy group, a saturated aliphatic acyl group, an alkoxycarbonyl group, a saturated aliphatic acyloxy group, a phenylalkyl group, which may have a substituent, a naphthylalkyl group, which may have a substituent, a heterocyclyl group, which may have a substituent, and an amino group substituted by one or two organic groups are the same as the examples of the substituent of the phenyl group in the case where $R^{c1}$ represents the phenyl group, which may have a substituent.

In the case where a phenyl group, a naphthyl group, or a heterocyclyl group contained in the substituent of the carbazolyl group represented by $R^{c1}$ further has a substituent, examples of the substituent include an alkyl group having 1 to 6 carbon atoms; an alkoxy group having 1 to 6 carbon atoms; a saturated aliphatic acyl group having 2 to 7 carbon atoms; an alkoxycarbonyl group having 2 to 7 carbon atoms; a saturated aliphatic acyloxy group having 2 to 7 carbon atoms; a phenyl group; a naphthyl group; a benzoyl group; a naphthoyl group; a benzoyl group substituted by a group selected from the group consisting of an alkyl group having 1 to 6 carbon atoms, a morpholin-1-yl group, a piperazin-1-yl group, and a phenyl group; a monoalkylamino group having an alkyl group having 1 to 6 carbon atoms; a dialkylamino group having an alkyl group having 1 to 6 carbon atoms; a morpholin-1-yl group; a piperazin-1-yl group; a halogen atom; a nitro group; and a cyano group. In the case where the phenyl group, the naphthyl group, or the heterocyclyl group contained in the substituent of the carbazolyl group further has a substituent, the number of the substituent is not particularly limited within a range that does not impair the objects of the invention, and is preferably 1 to 4. In the case where the phenyl group, the naphthyl group, or the heterocyclyl group has plural substituents, the plural substituents may be the same as or different from each other.

$R^{c2}$ represents an alkyl group having 1 to 10 carbon atoms, which may have a substituent, a phenyl group, which may have a substituent, or a carbazolyl group, which may have a substituent.

In the case where $R^{c2}$ represents an alkyl group having 1 to 10 carbon atoms, which may have a substituent, the alkyl group may be a linear chain or a branched chain. In this case, the number of carbon atoms of the alkyl group is preferably 1 to 8, and more preferably 1 to 5.

The substituent of the alkyl group or the phenyl group represented by $R^{c2}$ is not particularly limited within a range that does not impair the objects of the invention.

Examples of the preferred substituent of the alkyl group substituted on the carbon atom thereof include an alkoxy group having 1 to 20 carbon atoms, a cycloalkyl group having 3 to 10 carbon atoms, a cycloalkoxy group having 3 to 10 carbon atoms, a saturated aliphatic acyl group having 2 to 20 carbon atoms, an alkoxycarbonyl group having 2 to 20 carbon atoms, a saturated aliphatic acyloxy group having 2 to 20 carbon atoms, a phenyl group, which may have a substituent, a phenoxy group, which may have a substituent, a phenylthio group, which may have a substituent, a benzoyl group, which may have a substituent, a phenoxycarbonyl group, which may have a substituent, a benzoyloxy group, which may have a substituent, a phenylalkyl group having 7 to 20 carbon atoms, which may have a substituent, a naphthyl group, which may have a substituent, a naphthoxy group, which may have a substituent, a naphthoyl group, which may have a substituent, a naphthoxycarbonyl group, which may have a substituent, a naphthoyloxy group, which may have a substituent, a naphthylalkyl group having 11 to 20 carbon atoms, which may have a substituent, a heterocyclyl group, which may have a substituent, a heterocyclylcarbonyl group, which may have a substituent, an amino group, an amino group substituted by one or two organic groups, a morpholin-1-yl group, a piperazin-1-yl group, a halogen atom, a nitro group, and a cyano group.

Examples of the preferred substituent of the phenyl group substituted on the carbon atom thereof include the groups described above for the examples of the preferred substituent of the alkyl group substituted on the carbon atom thereof, and also include an alkyl group having 1 to 20 carbon atoms.

Specific examples of the substituent of the alkyl group or the phenyl group for an alkyl group, an alkoxy group, a cycloalkyl group, a cycloalkoxy group, a saturated aliphatic acyl group, an alkoxycarbonyl group, a saturated aliphatic acyloxy group, a phenylalkyl group, which may have a substituent, a naphthylalkyl group, which may have a substituent, a heterocyclyl group, which may have a substituent, and an amino group substituted by one or two organic groups are the same as the examples of the substituent of the phenyl group in the case where $R^{c1}$ represents the phenyl group, which may have a substituent.

In the case where a phenyl group, a naphthyl group, or a heterocyclyl group contained in the substituent of the alkyl group or the phenyl group represented by $R^{c2}$ further has a substituent, examples of the substituent include an alkyl group having 1 to 6 carbon atoms; an alkoxy group having 1 to 6 carbon atoms; a saturated aliphatic acyl group having 2 to 7 carbon atoms; an alkoxycarbonyl group having 2 to 7 carbon atoms; a saturated aliphatic acyloxy group having 2 to 7 carbon atoms; a phenyl group; a naphthyl group; a benzoyl group; a naphthoyl group; a benzoyl group substituted by a group selected from the group consisting of an alkyl group having 1 to 6 carbon atoms, a morpholin-1-yl group, a piperazin-1-yl group, and a phenyl group; a monoalkylamino group having an alkyl group having 1 to 6 carbon atoms; a dialkylamino group having an alkyl group having 1 to 6 carbon atoms; a morpholin-1-yl group; a piperazin-1-yl group; a halogen atom; a nitro group; and a cyano group. In the case where the phenyl group, the naphthyl group, or the heterocyclyl group contained in the substituent of the alkyl group or the phenyl group further has a substituent, the number of the substituent is not particularly limited within a range that does not impair the objects of the invention, and is preferably 1 to 4. In the case where the phenyl group, the naphthyl group, or the heterocyclyl group has plural substituents, the plural substituents may be the same as or different from each other.

In the case where $R^{c2}$ represents a carbazolyl group, which may have a substituent, the kind of the substituent is not particularly limited within a range that does not impair the objects of the invention. Preferred examples of the substituent of the carbazolyl group are the same as the examples of the substituent in the case where $R^{c1}$ represents a carbazolyl group, which may have a substituent.

$R^{c2}$ preferably represents a group represented by the following formula (c2) or (c3) from the standpoint of the reactivity of the compound represented by the formula (c1).

[Chemical formula 2]

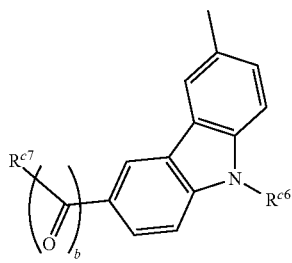

(c2)

[Chemical formula 3]

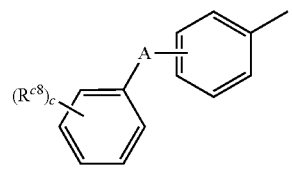

(c3)

In the formula (c2), $R^{c6}$ and $R^{c7}$ each represent a monovalent organic group; and b represents 0 or 1. In the formula (c3), $R^{c8}$ represents a group selected from the group consisting of a monovalent organic group, an amino group, a halogen atom, a nitro group, and a cyano group; A represents S or O; and c represents an integer of 0 to 4.

In the formula (c2), $R^{c6}$ may be selected from various organic groups within a range that does not impair the objects of the invention. Preferred examples of $R^{c6}$ include a hydrogen atom, an alkyl group having 1 to 20 carbon atoms, a cycloalkyl group having 3 to 10 carbon atoms, a saturated aliphatic acyl group having 2 to 20 carbon atoms, an alkoxy carbonyl group having 2 to 20 carbon atoms, a phenyl group, which may have a substituent, a benzoyl group, which may have a substituent, a phenoxycarbonyl group, which may have a substituent, a phenylalkyl group having 7 to 20 carbon atoms, which may have a substituent, a naphthyl group, which may have a substituent, a naphthoyl group, which may have a substituent, a naphthoxycarbonyl group, which may have a substituent, a naphthylalkyl group having 11 to 20 carbon atoms, which may have a substituent, a heterocyclyl group, which may have a substituent, and a heterocyclylcarbonyl group, which may have a substituent.

In the groups represented by $R^{c6}$, an alkyl group having 1 to 20 carbon atoms is preferred, an alkyl group having 1 to 6 carbon atoms is more preferred, and an ethyl group is particularly preferred.

In the formula (c2), $R^{c7}$ is not particularly limited within a range that does not impair the objects of the invention, and may be selected from various organic groups. Specific examples of the preferred group represented by $R^{c7}$ include a hydrogen atom, an alkyl group having 1 to 20 carbon atoms, a phenyl group, which may have a substituent, a naphthyl group, which may have a substituent, and a heterocyclyl group, which may have a substituent. In the groups represented by $R^{c7}$, a phenyl group, which may have a substituent, and a naphthyl group, which may have a substituent, are more preferred, and a 2-methylphenyl group and a naphthyl group are particularly preferred.

In the case where a phenyl group, a naphthyl group, or a heterocyclyl group contained in $R^{c6}$ or $R^{c7}$ further has a substituent, examples of the substituent include an alkyl group having 1 to 6 carbon atoms, an alkoxy group having 1 to 6 carbon atoms, a saturated aliphatic acyl group having 2 to 7 carbon atoms, an alkoxycarbonyl group having 2 to 7 carbon atoms, a saturated aliphatic acyloxy group having 2 to 7 carbon atoms, a monoalkylamino group having an alkyl group having 1 to 6 carbon atoms, a dialkylamino group having an alkyl group having 1 to 6 carbon atoms, a morpholin-1-yl group, a piperazin-1-yl group, a halogen atom, a nitro group, and a cyano group. In the case where the phenyl group, the naphthyl group, or the heterocyclyl group contained in $R^{c6}$ or $R^{c7}$ further has a substituent, the number of the substituent is not particularly limited within a range that does not impair the objects of the invention, and is preferably 1 to 4. In the case where the phenyl group, the naphthyl group, or the heterocyclyl group contained in $R^{c6}$ or $R^{c7}$ has plural substituents, the plural substituents may be the same as or different from each other.

In the formula (c3), in the case where $R^{c8}$ represents an organic group, $R^{c8}$ may be selected from various organic groups within a range that does not impair the objects of the invention. In the formula (c3), in the case where $R^{c8}$ represents an organic group, preferred examples of the organic group include an alkyl group having 1 to 6 carbon atoms; an alkoxy group having 1 to 6 carbon atoms; a saturated aliphatic acyl group having 2 to 7 carbon atoms; an alkoxycarbonyl group having 2 to 7 carbon atoms; a saturated aliphatic acyloxy group having 2 to 7 carbon atoms; a phenyl group; a naphthyl group; a benzoyl group; a naphthoyl group; a benzoyl group substituted by a group selected from the group consisting of an alkyl group having 1 to 6 carbon atoms, a morpholin-1-yl group, a piperazin-1-yl group, and a phenyl group; a monoalkylamino group having an alkyl group having 1 to 6 carbon atoms; a dialkylamino group having an alkyl group having 1 to 6 carbon atoms; a morpholin-1-yl group; a piperazin-1-yl group; a halogen atom; a nitro group; a cyano group; a 2-methylphenylcarbonyl group; a 4-(piperazin-1-yl)phenylcarbonyl group; and a 4-(phenyl)phenylcarbonyl group.

In the groups represented by $R^{c8}$, a benzoyl group; a naphthoyl group; a benzoyl group substituted by a group selected from the group consisting of an alkyl group having 1 to 6 carbon atoms, a morpholin-1-yl group, a piperazin-1-yl group, and a phenyl group; and a nitro group are preferred, and a benzoyl group; a naphthoyl group; a 2-methylphenylcarbonyl group; a 4-(piperazin-1-yl)phenylcarbonyl group; and a 4-(phenyl)phenylcarbonyl group are more preferred.

In the formula (c3), c preferably represents an integer of 0 to 3, more preferably 0 to 2, and particularly preferably 0 or 1. In the case where c represents 1, the position where $R^{c8}$ is bonded to the phenyl group is preferably the p-position with respect to A (i.e., the sulfur atom or the oxygen atom) which bonds to the phenyl group having $R^{c8}$.

$R^{c3}$ represents a hydrogen atom, an alkyl group having 1 to 6 carbon atoms, or a phenyl group, which may have a substituent. In the case where $R^{c3}$ represents a phenyl group, which may have a substituent, the substituent of the phenyl group may be the same as the substituent in the case where $R^{c1}$ represents a phenyl group, which may have a substituent. $R^{c3}$ preferably represents a methyl group, an ethyl group, or a phenyl group, and more preferably a methyl group or a phenyl group.

The oxime ester compound represented by the formula (c1), in which a is 0, may be synthesized, for example, by the method described below. A ketone compound represented by $R^{c2}$—CO—$R^{c1}$ is oximated with hydroxylamine to provide an oxime compound represented by $R^{c2}$—(C=N—OH)—$R^{c1}$. Subsequently, the resulting oxime compound is acylated with an acid halide represented by $R^{c3}$—CO-Hal (in which Hal represents a halogen atom) or an acid anhydride represented by $(R^{c3}CO)_2O$ to provide an oxime ester compound represented by the formula (c1), in which a is 0.

The oxime ester compound represented by the formula (c1), in which a is 1, may be synthesized, for example, by the method described below. A ketone compound represented by $R^{c2}$—CO—$CH_2$—$R^{c1}$ is reacted with a nitrite ester in the presence of a hydrochloric acid to provide an oxime compound represented by $R^{c2}$—CO—(C=N—OH)—$R^{c1}$. Subsequently, the resulting oxime compound is acylated with an acid halide represented by $R^{c3}$—CO-Hal (in which Hal represents a halogen atom) or an acid anhydride represented by $(R^{c3}CO)_2O$ to provide an oxime ester compound represented by the formula (c1), in which a is 1.

Examples of the compound represented by the formula (c1) include a compound represented by the following formula (c4).

[Chemical formula 4]

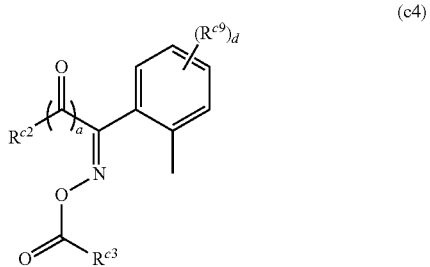

(c4)

In the formula (c4), a, $R^{c2}$, and $R^{c3}$ are the same as above. $R^{c9}$ represents a group selected from the group consisting of a monovalent organic group, an amino group, a halogen atom, a nitro group, and a cyano group; and d represents an integer of 0 to 4.

In the formula (c4), $R^{c9}$ is not particularly limited within a range that does not impair the objects of the invention, and in the case where $R^{c9}$ represents an organic group, the organic group may be appropriately selected from various organic groups. Preferred examples of $R^{c9}$ include an alkyl group, an alkoxy group, a cycloalkyl group, a cycloalkoxy group, a saturated aliphatic acyl group, an alkoxycarbonyl group, a saturated aliphatic acyloxy group, a phenyl group, which may have a substituent, a phenoxy group, which may have a substituent, a benzoyl group, which may have a substituent, a phenoxycarbonyl group, which may have a substituent, a benzoyloxy group, which may have a substituent, a phenylalkyl group, which may have a substituent, a naphthyl group, which may have a substituent, a naphthoxy group, which may have a substituent, a naphthoyl group, which may have a substituent, a naphthoxycarbonyl group, which may have a substituent, a naphthoyloxy group, which may have a substituent, a naphthylalkyl group, which may have a substituent, a heterocyclyl group, which may have a substituent, an amino group, an amino group substituted by one or two organic groups, a morpholin-1-yl group, a piperazin-1-yl group, a halogen atom, a nitro group, and a cyano group. In the case where d represents an integer of 2 to 4, the groups represented by $R^{c9}$ may be the same as or different from each other. The number of carbon atoms of the substituent does not include the number of carbon atoms of an additional substituent that the substituent further has.

In the case where $R^{c9}$ represents an alkyl group, the number of carbon atoms thereof is preferably 1 to 20, and more preferably 1 to 6. In the case where $R^{c9}$ represents an alkyl group, the alkyl group may be a linear chain or a branched chain. Specific examples of the alkyl group represented by $R^{c9}$ include a methyl group, an ethyl group, a n-propyl group, an isopropyl group, a n-butyl group, an isobutyl group, a sec-butyl group, a tert-butyl group, a n-pentyl group, an isopentyl group, a sec-pentyl group, a tert-pentyl group, a n-hexyl group, a n-heptyl group, a n-octyl group, an isooctyl group, a sec-octyl group, a tert-octyl group, a n-nonyl group, an isononyl group, a n-decyl group, and an isodecyl group. In the case where $R^{c9}$ represents an alkyl group, the alkyl group may contain an ether bond (—O—) in the carbon chain thereof. Examples of the alkyl group containing an ether bond in the carbon chain thereof include a methoxyethyl group, an ethoxyethyl group, a methoxyethoxyethyl group, an ethoxyethoxyethyl group, a propyloxyethoxyethyl group, and methoxypropyl group.

In the case where $R^{c9}$ represents an alkoxy group, the number of carbon atoms thereof is preferably 1 to 20, and more preferably 1 to 6. In the case where $R^{c9}$ represents an alkoxy group, the alkoxy group may be a linear chain or a branched chain. Specific examples of the alkoxy group represented by $R^{c9}$ include a methoxy group, an ethoxy group, a n-propyloxy group, an isopropyloxy group, a n-butyloxy group, an isobutyloxy group, a sec-butyloxy group, a tert-butyloxy group, a n-pentyloxy group, an isopentyloxy group, a sec-pentyloxy group, a tert-pentyloxy group, a n-hexyloxy group, a n-heptyloxy group, a n-octyloxy group, an isooctyloxy group, a sec-octyloxy group, a tert-octyloxy group, a n-nonyloxy group, an isononyloxy group, a n-decyloxy group, and an isodecyloxy group. In the case where $R^{c9}$ represents an alkoxy group, the alkoxy group may contain an ether bond (—O—) in the carbon chain thereof. Examples of the alkoxy group containing an ether bond in the carbon chain thereof include a methoxyethoxy group, an ethoxyethoxy group, a methoxyethoxyethoxy group, an ethoxyethoxyethoxy group, a propyloxyethoxyethoxy group, and methoxypropyloxy group.

In the case where $R^{c9}$ represents a cycloalkyl group or a cycloalkoxy group, the number of carbon atoms thereof is preferably 3 to 10, and more preferably 3 to 6. Specific examples of the cycloalkyl group represented by $R^{c9}$ include a cyclopropyl group, a cyclobutyl group, a cyclopentyl group, a cyclohexyl group, a cycloheptyl group, and a cyclooctyl group, and specific examples of the cycloalkoxy group represented by $R^{c9}$ include a cyclopropyloxy group, a cyclobutyloxy group, a cyclopentyloxy group, a cyclohexyloxy group, a cycloheptyloxy group, and cyclooctyloxy group.

In the case where $R^{c9}$ represents a saturated aliphatic acyl group or a saturated aliphatic acyloxy group, the number of carbon atoms thereof is preferably 2 to 20, and more preferably 2 to 7. Specific examples of the saturated aliphatic acyl group represented by $R^{c9}$ include an acetyl group, a propanoyl group, a n-butanoyl group, a 2-methylpropanoyl group, a n-pentanoyl group, a 2,2-dimethylpropanoyl group, a n-hexanoyl group, a n-heptanoyl group, a n-octanoyl group, a n-nonanoyl group, a n-decanoyl group, a n-undecanoyl group, a n-dodecanoyl group, a n-tridecanoyl group, a n-tetradecanoyl group, a n-pentadecanoyl group, and a n-hexadecanoyl group. Specific examples of the saturated aliphatic acyloxy group represented by $R^{c9}$ include an acetyloxy group, a propanoyloxy group, a n-butanoyloxy group, a 2-methylpropanoyloxy group, a n-pentanoyloxy group, a 2,2-dimethylpropanoyloxy group, a n-hexanoyloxy group, a n-heptanoyloxy group, a n-octanoyloxy group, a n-nonanoyloxy group, a n-decanoyloxy group, a n-undecanoyloxy group, a n-dodecanoyloxy group, a n-tridecanoyloxy group, a n-tetradecanoyloxy group, a n-pentadecanoyloxy group, and a n-hexadecanoyloxy group.

In the case where $R^{c9}$ represents an alkoxycarbonyl group, the number of carbon atoms thereof is preferably 2 to 20, and more preferably 2 to 7. Specific examples of the alkoxycarbonyl group represented by $R^{c9}$ include a methoxycarbonyl group, an ethoxycarbonyl group, a n-propyloxycarbonyl group, an isopropyloxycarbonyl group, a n-butyloxycarbonyl group, an isobutyloxycarbonyl group, a sec-butyloxycarbonyl group, a tert-butyloxycarbonyl group, a n-pentyloxycarbonyl group, an isopentyloxycarbonyl group, a sec-pentyloxycarbonyl group, a tert-pentyloxycarbonyl group, a n-hexyloxycarbonyl group, a n-heptyloxycarbonyl group, a n-octyloxycarbonyl group, an isooctyloxycarbonyl group, a sec-octyloxycarbonyl group, a tert-octyloxycarbonyl group, a n-nonyloxycarbonyl group, an isononyloxycarbonyl group, a n-decyloxycarbonyl group, and an isodecyloxycarbonyl group.

In the case where $R^{c9}$ represents a phenylalkyl group, the number of carbon atoms thereof is preferably 7 to 20, and more preferably 7 to 10. In the case where $R^{c9}$ represents a naphthylalkyl group, the number of carbon atoms thereof is preferably 11 to 20, and more preferably to 14. Specific examples of the phenylalkyl group represented by $R^{c9}$ include a benzyl group, a 2-phenylethyl group, a 3-phenylpropyl group, and a 4-phenylbutyl group. Specific examples of the naphthylalkyl group represented by $R^{c9}$ include an α-naphthylmethyl group, a β-naphthylmethyl group, a 2-(α-naphthyl)ethyl group, and a 2-(β-naphthyl)ethyl group. In the case where $R^{c9}$ represents a phenylalkyl group or a naphthylalkyl group, $R^{c9}$ may further have a substituent on the phenyl group or the naphthyl group.

In the case where $R^{c9}$ represents a heterocyclyl group, the heterocyclyl group may be a 5-membered or 6-membered monocyclic ring containing one or more of N, S, and O, or may contain the monocyclic rings condensed with each other or the monocyclic ring and a benzene ring condensed with each other. In the case where the heterocyclyl group is the condensed ring, the number of the condensed rings may be 3 or less. Examples of the heterocyclic ring constituting the heterocyclyl group include furan, thiophene, pyrrole, oxazole, isoxazole, thiazole, thiadiazole, isothiazole, imidazole, pyrazole, triazole, pyridine, pyrazine, pyrimidine, pyridazine, benzofuran, benzothiophene, indole, isoindole, indolizine, benzimidazole, benzotriazole, benzoxazole, benzothiazole, carbazole, purine, quinoline, isoquinoline, quinazoline, phthalazine, cinnoline, and quinoxaline. In the case where $R^{c9}$ represents a heterocyclyl group, the heterocyclyl group may further have a substituent.

In the case where $R^{c9}$ represents an amino group substituted by one or two organic groups, preferred examples of the organic group include an alkyl group having 1 to 20 carbon atoms, a cycloalkyl group having 3 to 10 carbon atoms, a saturated aliphatic acyl group having 2 to 20 carbon atoms, a phenyl group, which may have a substituent, a benzoyl group, which may have a substituent, a phenylalkyl group having 7 to 20 carbon atoms, which may have a substituent, a naphthyl group, which may have a substituent, a naphthoyl group, which may have a substituent, a naphthylalkyl group having 11 to 20 carbon atoms, which may have a substituent, and a heterocyclyl group. Specific examples of the preferred organic groups are the same as those exemplified as the organic group for $R^{c9}$. Specific examples of the amino group substituted by one or two organic groups include a methylamino group, an ethylamino group, a diethylamino group, a n-propylamino group, a di-n-propylamino group, an isopropylamino group, a n-butylamino group, a di-n-butylamino group, a n-pentylamino group, a n-hexylamino group, a n-heptylamino group, a n-octylamino group, a n-nonylamino group, a n-decylamino group, a phenylamino group, a naphthylamino group, an acetylamino group, a propanoylamino group, a n-butanoylamino group, a n-pentanoylamino group, a n-hexanoylamino group, a n-heptanoylamino group, a n-octanoylamino group, a n-decanoylamino group, a benzoylamino group, an α-naphthoylamino group, and a β-naphthoylamino group.

In the case where a phenyl group, a naphthyl group, or a heterocyclyl group contained in $R^{c9}$ further has a substituent, examples of the substituent include an alkyl group having 1 to 6 carbon atoms, an alkoxy group having 1 to 6 carbon atoms, a saturated aliphatic acyl group having 2 to 7 carbon atoms, an alkoxycarbonyl group having 2 to 7 carbon atoms, a saturated aliphatic acyloxy group having 2 to 7 carbon atoms, a monoalkylamino group having an alkyl group having 1 to 6 carbon atoms, a dialkylamino group having an alkyl group having 1 to 6 carbon atoms, a morpholin-1-yl group, a piperazin-1-yl group, a halogen atom, a nitro group, and a cyano group. In the case where the phenyl group, the naphthyl group, or the heterocyclyl group contained in $R^{c9}$ further has a substituent, the number of the substituent is not particularly limited within a range that does not impair the objects of the invention, and is preferably 1 to 4. In the case where the phenyl group, the naphthyl group, or the heterocyclyl group contained in $R^{c9}$ has plural substituents, the plural substituents may be the same as or different from each other.

In the groups represented by $R^{c9}$, a group selected from the group consisting of an alkyl group having 1 to 6 carbon atoms, an alkoxy group having 1 to 6 carbon atoms, and a saturated aliphatic acyl group having 2 to 7 carbon atoms is preferred, an alkyl group having 1 to 6 carbon atoms is more preferred, and a methyl group is particularly preferred, due to the good chemical stability, the small steric hindrance, and the easiness in synthesis of the oxime ester compound.

The position where $R^{c9}$ is bonded to the phenyl group is preferably the 4-position or the 5-position, and more preferably the 5-position, assuming that in the phenyl group having $R^{c9}$ bonded thereto, the position of the bond between the phenyl group and the main skeleton of the oxime ester compound is the 1-position, and the position of the methyl group is the 2-position. In the formula (c4), d preferably represents an integer of 0 to 3, more preferably an integer of 0 to 2, and particularly preferably 0 or 1.

In the formula (c4), $R^{c3}$ represents a hydrogen atom, an alkyl group having 1 to 6 carbon atoms, or a phenyl group, which may have a substituent. Specific examples of $R^{c3}$ include those described above for the formula (c1). In the formula (c4), $R^{c3}$ preferably represents a methyl group, an ethyl group, or a phenyl group, and more preferably a methyl group or a phenyl group.

In the oxime ester compound, preferred examples of the compound that is included in the formula (c1) but is not included in the formula (c4) include the following compounds.

[Chemical formula 5]
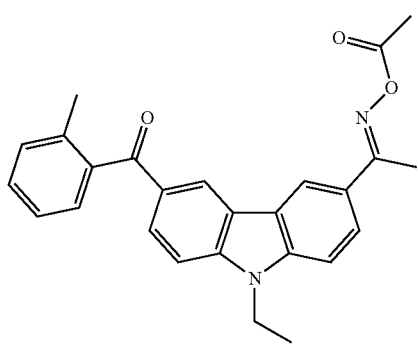
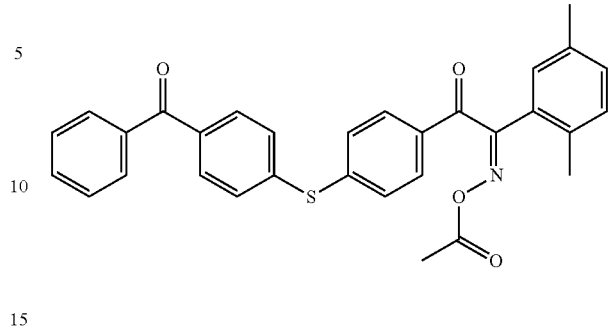
PI-3
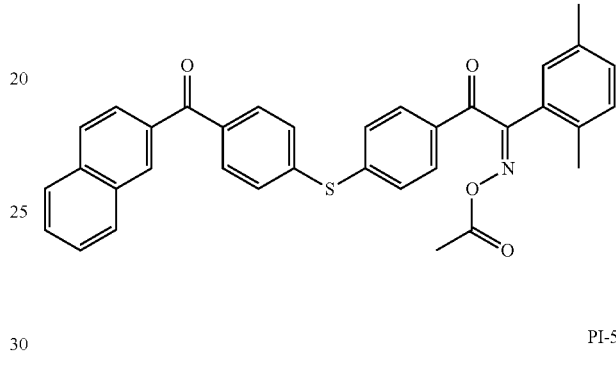
PI-4
Examples of the particularly preferred compound of the oxime ester compound represented by the formula (c4), which is particularly preferred as the oxime ester compound, include the following compounds.
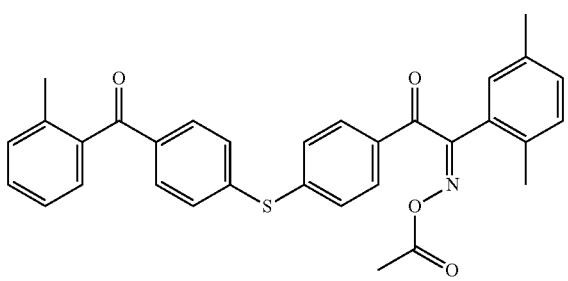
PI-5
[Chemical formula 6]
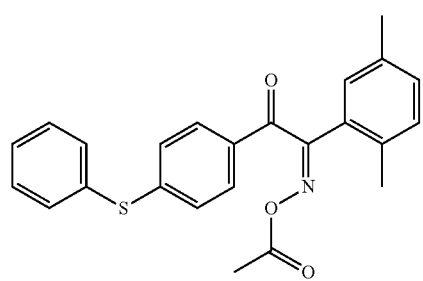
PI-1
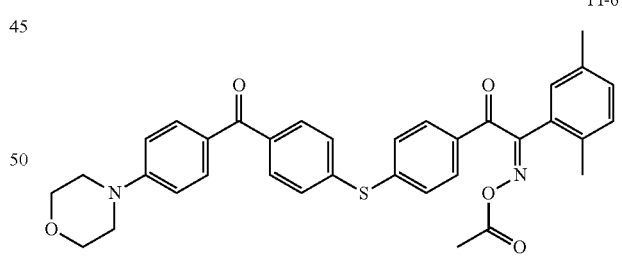
PI-6
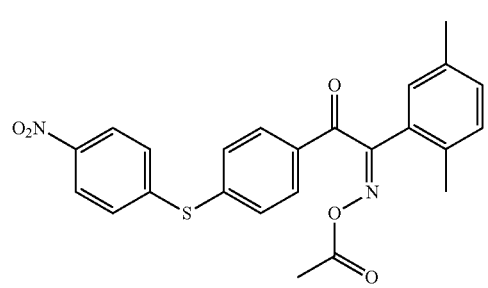
PI-2
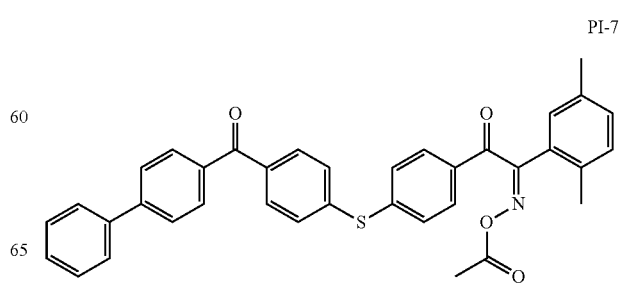
PI-7

[Chemical formula 7]

PI-8
PI-9
PI-10
PI-11
PI-12
PI-13

[Chemical formula 8]

PI-14
PI-15
PI-16
PI-17
PI-18

PI-19
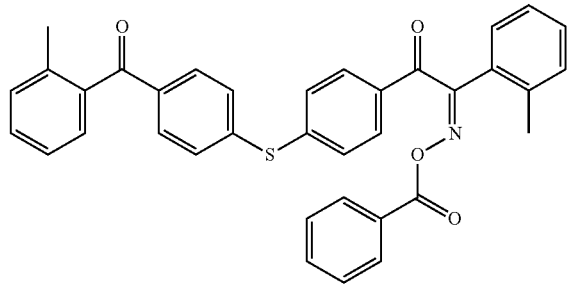
PI-20
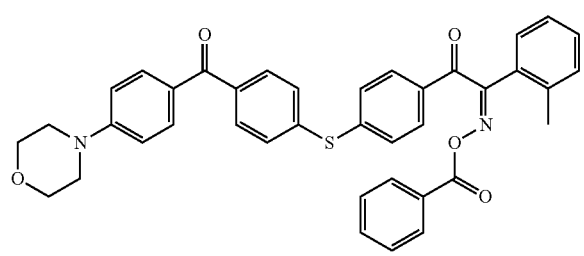
PI-21
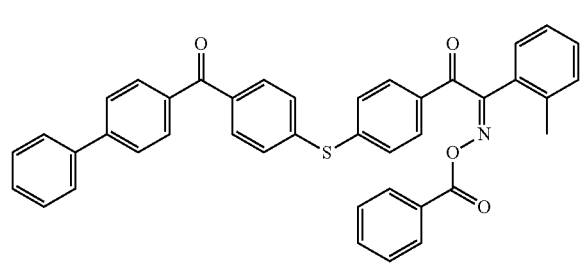
[Chemical formula 9]
PI-22
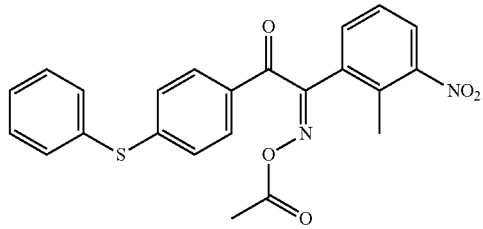
PI-23
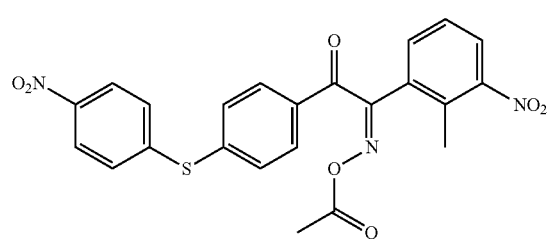
PI-24
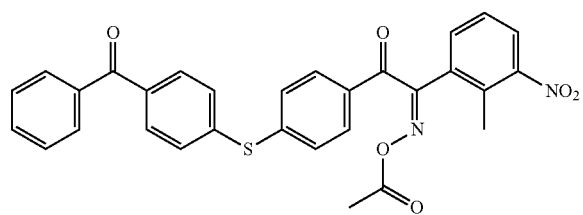
PI-25
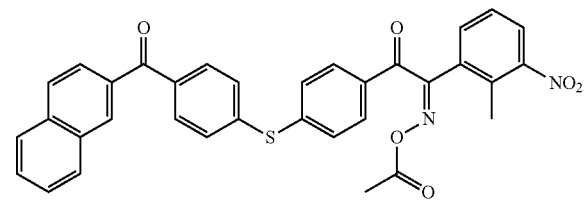
PI-26
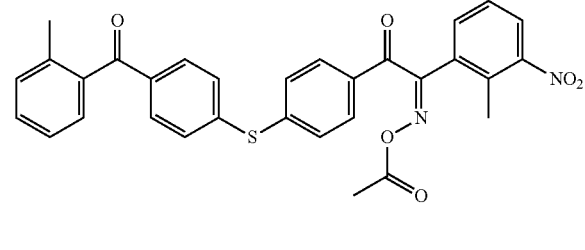
PI-27
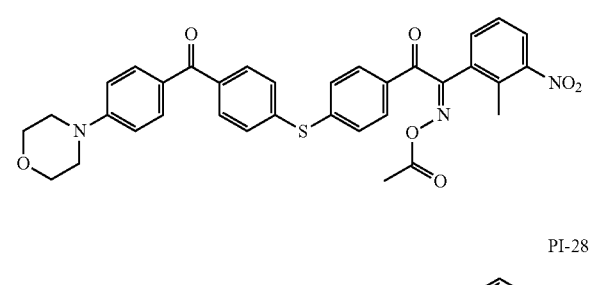
PI-28
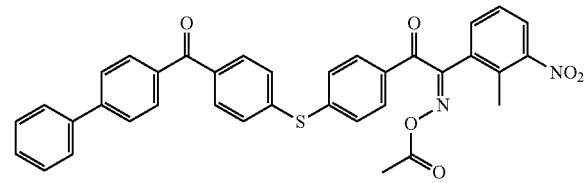
[Chemical formula 10]
PI-29
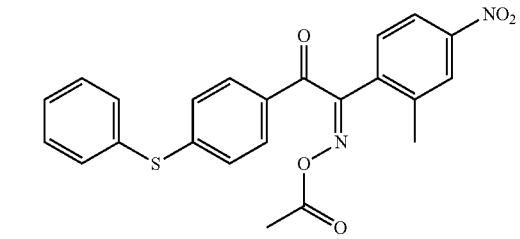
PI-30
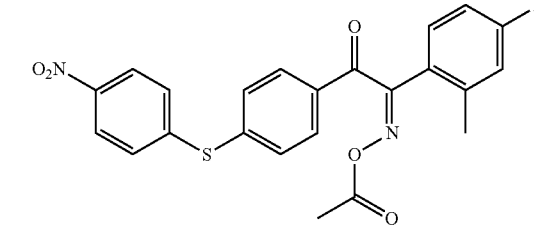

PI-31
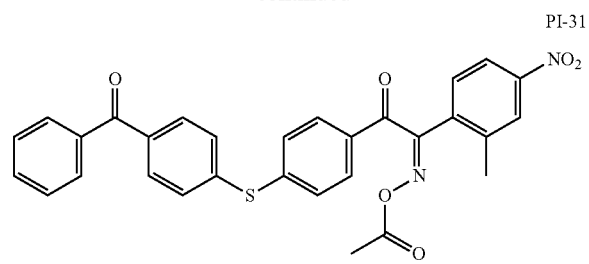
PI-32
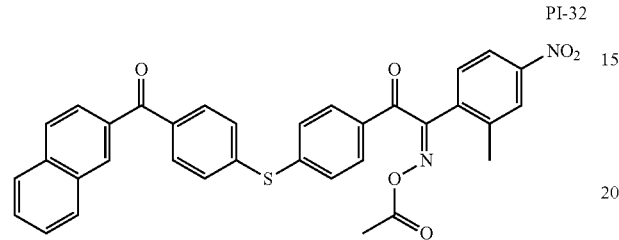
PI-33
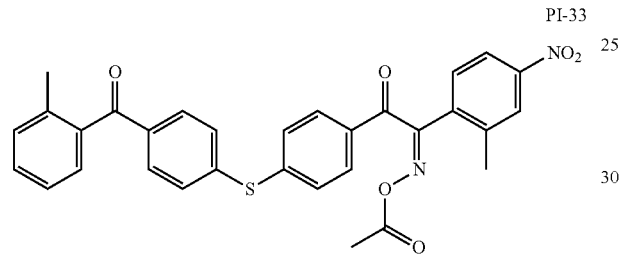
PI-34
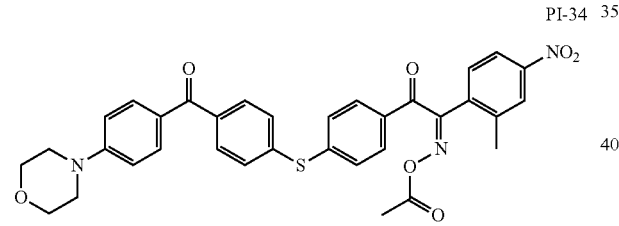
PI-35
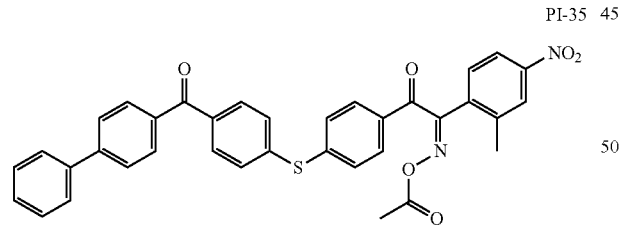
[Chemical formula 11]
PI-36
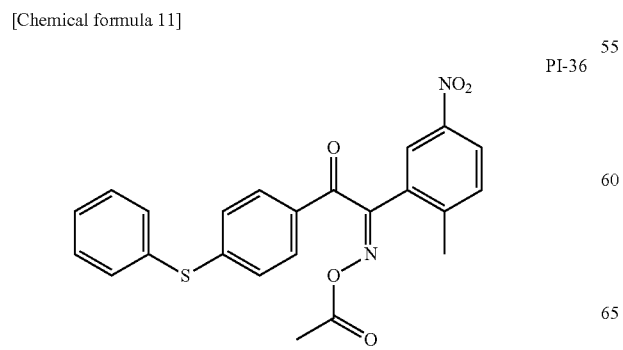
PI-37
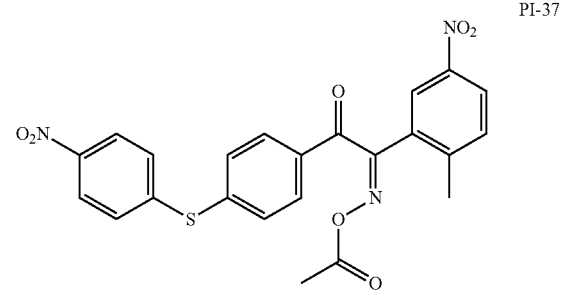
PI-38
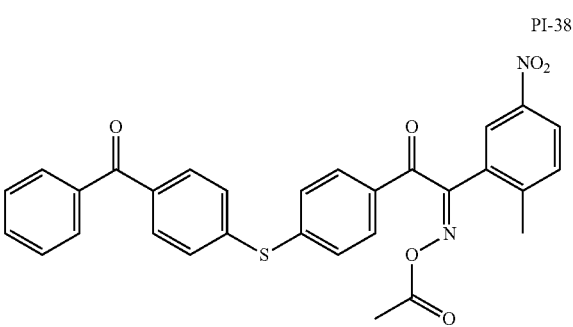
PI-39
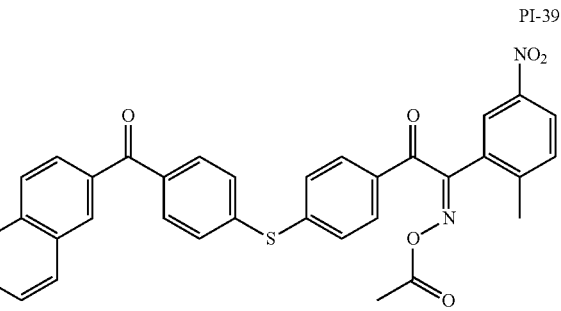
PI-40
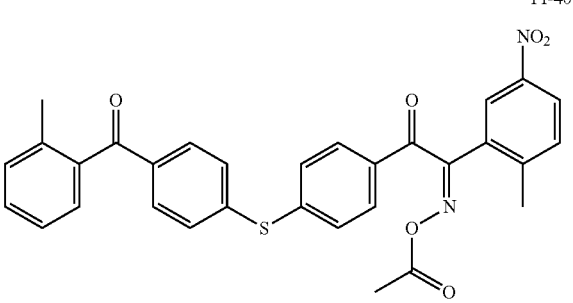
PI-41
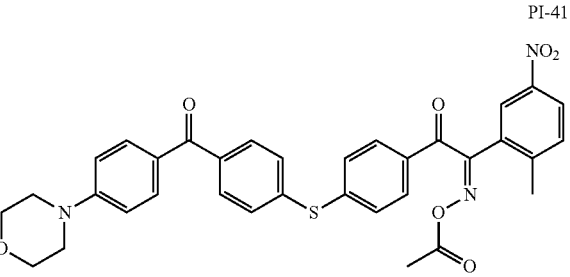

PI-42

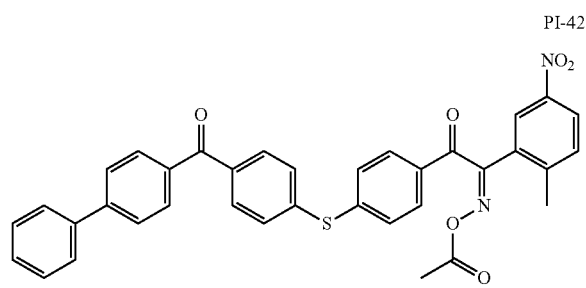

[Chemical formula 12]

PI-43

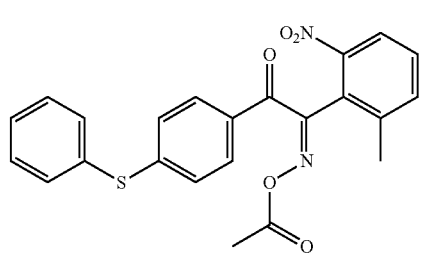

PI-44

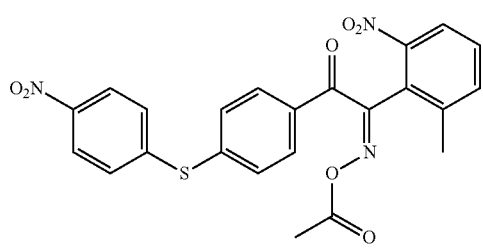

PI-45

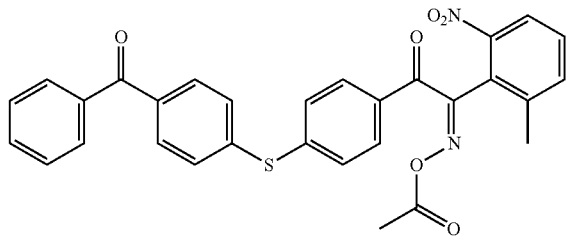

PI-46

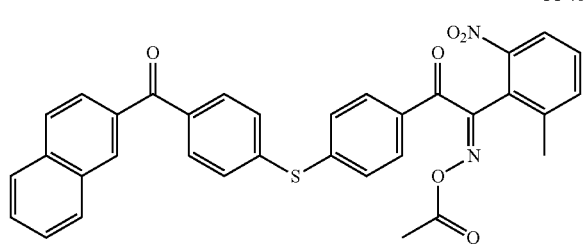

PI-47

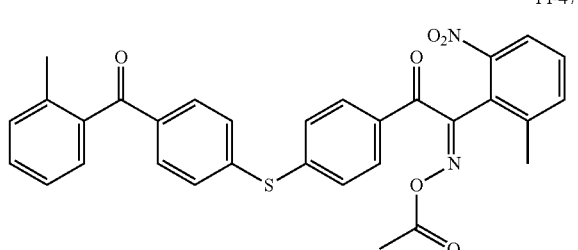

PI-48

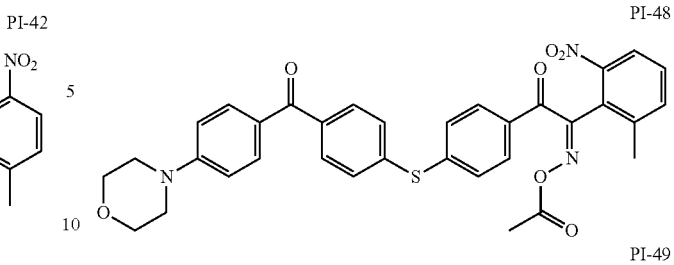

PI-49

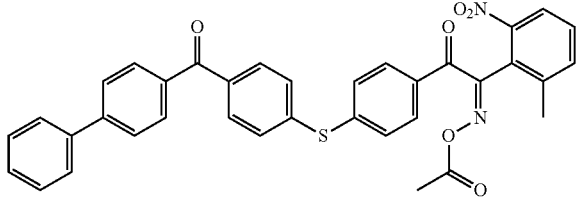

In the case where the photopolymerization initiator (C) contains the oxime ester compound, the photopolymerization initiator (C) preferably contains only the oxime ester compound, and may contain a compound other than the oxime ester compound. The content of the compound other than the oxime ester compound in the photopolymerization initiator (C) is preferably 10 mass % or less, more preferably 5 mass % or less, and particularly preferably 3 mass % or less, based on the total mass of the photopolymerization initiator (C).

The content of the photopolymerization initiator (C) is preferably 0.5 to 50 parts by mass, more preferably 1 to 20 parts by mass, and particularly preferably 1.5 to 12 parts by mass, per 100 parts by mass of the water-soluble resin (A). When the content is in the range, the photosensitive resin composition that has both good coating property and good curing property may be easily obtained.

The photosensitive resin composition according to the invention contains the water-soluble resin, and therefore the kind of an organic solvent that is capable of being used in the photosensitive resin composition may be restricted in some cases depending on the kind of the water-soluble resin used. On the other hand, the usable organic solvent may not be necessarily a good solvent for the photopolymerization initiator (C). Accordingly, it is preferred to use the oxime ester compound, which provides good sensitivity with a small amount thereof added.

(S) Organic Solvent

The photosensitive resin composition preferably contains an organic solvent for dilution. The organic solvent used may be a polar solvent or a non-polar solvent. Examples of the organic solvent include a (poly)alkylene glycol monoalkyl ether compound, such as ethylene glycol monomethyl ether, ethylene glycol monoethyl ether, ethylene glycol mono-n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, and tripropylene glycol monoethyl ether; a (poly)alkylene glycol monoalkyl ether acetate compound, such as ethylene glycol monomethyl ether acetate, ethylene glycol monoethyl ether acetate, diethylene glycol monomethyl ether acetate, diethylene glycol monoethyl ether acetate, propylene glycol monomethyl ether acetate, and propylene glycol monoethyl ether acetate; other ether compounds, such as diethylene glycol dimethyl ether, diethylene glycol methyl ethyl ether, diethylene glycol diethyl ether, and tetrahydrofuran; a ketone compound, such as methyl ethyl ketone, cyclohexanone, 2-heptanone, and 3-heptanone; an alkyl lactate ester compound, such as methyl 2-hydroxypropionate and ethyl 2-hydroxypropionate; other ester compounds, such as ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutanoate, 3-methoxybutyl acetate, 3-methyl-3-methoxybutyl acetate, 3-methyl-3-methoxybutyl propionate, ethyl acetate, n-propyl acetate, isopropyl acetate, n-butyl acetate, isobutyl acetate, n-pentyl formate, isopentyl acetate, n-butyl propionate, ethyl butyrate, n-propyl butyrate, isopropyl butyrate, n-butyl butyrate, methyl pyruvate, ethyl pyruvate, n-propyl pyruvate, methyl acetoacetate, ethyl acetoacetate, and ethyl 2-oxobutanoic acid; an aromatic hydrocarbon compound, such as toluene and xylene; and an amide compound, such as N-methylpyrrolidone, N,N-dimethylformamide, and N,N-dimethylacetamide.

Among these, a polar solvent is preferably used for favorably dissolving the water-soluble resin. More specifically, a (poly)alkylene glycol monoalkyl ether compound, a (poly)alkylene glycol monoalkyl ether acetate compound, a ketone compound, the aforementioned other ether compounds, an alkyl lactate ester compound, and the aforementioned other ester compounds are preferred, and a (poly)alkylene glycol monoalkyl ether acetate compound, a ketone compound, the aforementioned other ether compounds, and the aforementioned other ester compounds are more preferred. The organic solvent (S) may be used solely or as a combination of two or more kinds thereof.

The content of the organic solvent (S) is preferably such an amount that provides a solid concentration of the photosensitive resin composition of 1 to 50 mass %, and more preferably such an amount that provides a solid concentration thereof of 5 to 30 mass %.

Additional Components

The photosensitive resin composition according to the invention may contain various additives depending on necessity as far as the effects of the invention are not impaired. Examples of the additives include an UV absorbent, an adhesion promoter, a sensitizer, a curing accelerator, a filler, an adhesion promoter, an antioxidant, an aggregation inhibitor, a thermal polymerization inhibitor, a defoaming agent, and a surfactant. Among these, the photosensitive resin composition according to the invention preferably contains a UV absorbent and/or a silane coupling agent for such purposes that the resulting resist pattern has a reduced tailing length and enhanced adhesion to a substrate, formation of scums is prevented, and deterioration of the resolution is prevented. The photosensitive resin composition according to the invention preferably does not contain glass powder, and more preferably does not contain an inorganic substance, for facilitating the enhancement of the stripping property and the thermal decomposition property of the resulting resist pattern.

Examples of the UV absorbent include ordinarily known materials, and specific examples thereof include 4-(diethylamino)azobenzene, α-naphthol, and β-naphthol.

The adhesion promoter used is preferably a silane coupling agent. Examples of the silane coupling agent include N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethylbutylidene)propylamine, vinyltrimethoxysilane, vinyltriethoxysilane, 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, p-stylyltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-phenyl-3-aminopropyltrimethoxysilane, hydrochloride of N-(vinylbenzyl)-2-aminoethyl-3-aminopropyltrimethoxysilane, tris(trimethoxysilylpropyl)isocyanurate, 3-ureidopropyltrialkoxysilane, 3-mercaptopropylmethyldimethoxysilane, 3-mercaptopropyltrimethoxysilane, bis(triethoxysilylpropyl) tetrasulfide, 3-isocyanatopropyltriethoxysilane, 3-(2-aminoethyl)aminopropyltrimethoxysilane, 3-phenylaminopropyltrimethoxysilane, 1,2-ethanediamine, hydrochloride of a N-(3-(trimethoxysilyl)propyl)-N-(ethenylphenyl)methyl) derivative, vinyltriacetoxysilane, allyltrimethoxysilane, 3-mercaptopropyltriethoxysilane, methyltrimethoxysilane, dimethyldimethoxysilane, trimethylmethoxysilane, methyltriethoxysilane, methyltriphenoxysilane, ethyltrimethoxysilane, n-propyltrimethoxysilane, diisopropyldimethoxysilane, isobutyltrimethoxysilane, diisobutyldimethoxysilane, isobutyltriethoxysilane, n-hexyltrimethoxysilane, n-hexyltriethoxysilane, cyclohexylmethyldimethoxysilane, n-octyltriethoxysilane, n-decyltrimethoxysilane, phenyltrimethoxysilane, n-octyldimethylchlorosilane, tetraethoxysilane, 1,1,1,3,3,3-hexamethyldisilane, methylmethoxysiloxane, dimethylphenylmethoxysiloxane, alkylalkoxysiloxane, vinyltris(2-methoxyethoxy)silane, 3-chloropropylmethyldimethoxysilane, 3-chloropropyltrimethoxysilane, and 3-methacryloyloxypropyltrimethoxysilane.

Method for Producing Resist Pattern for Dry Etching

The method for producing a resist pattern for dry etching according to the invention contains:

a resin layer forming step of forming a resin layer with the photosensitive resin composition according to the invention on a substrate;

an exposing step of exposing the resin layer positionally selectively; and a developing step of developing the exposed resin layer with water at a temperature less than 50° C., so as to form a resist pattern. In the method for producing a resist pattern for dry etching according to the invention, by using the photosensitive resin composition according to the invention, the development may be performed with water at a temperature less than 50° C. without the use of an alkali and an organic solvent. The developing solution used in the method for producing a resist pattern for dry etching according to the invention is water at a temperature of less than 50° C., and can be used favorably in the subsequent process steps since it does not contain deleterious or toxic substances and dangerous substance and does not have a flashing point.

In the resin layer forming step, for example, the photosensitive resin composition may be coated on a substrate to form a resin layer. More specifically, the photosensitive resin composition may be coated on a substrate, such as a Si wafer, by using a contact type coating machine, such as a roll coater, a reverse coater, and a bar coater, or a non-contact type coating machine, such as a spinner (rotation coating machine) and a curtain flow coater. After coating, the solvent may be removed by drying depending on necessity, and thus a photosensitive resin composition film is formed.

In the resin layer forming step, the resin layer may be formed on the substrate in such a manner that a resin layer of the photosensitive resin composition formed on a support film (dry film) is bonded to the substrate. The dry film may be prepared by an ordinary method, for example, by coating the photosensitive resin composition on the support film and then dried.

Subsequently, the resin layer is irradiated with an active energy ray, such as an ultraviolet ray and an excimer laser ray, through a negative mask. The exposure may be performed by using a light source emitting an ultraviolet ray, such as a high-pressure mercury vapor lamp, an ultrahigh-pressure mercury vapor lamp, a xenon lamp, and a carbon arc lamp. The exposure amount may vary depending on the composition of the photosensitive resin composition, and is preferably, for example, 10 to 600 mJ/cm$^2$.

Subsequently, the resin layer having been exposed positionally selectively is developed with water at a temperature of less than 50° C., so as to form a resist pattern. The developing method is not particularly limited, and a dipping method, a spraying method and the like may be used. The development may be performed in the presence of a surfactant in addition to water at a temperature of less than 50° C., as far as the development is performed in the absence of an alkali, such as tetramethylammonium hydroxide (TMAH). The surfactant is not particularly limited, and known ones may be used. The temperature of water used as a developing solution is less than 50° C., preferably 10 to 40° C., and more preferably 15 to 35° C.

Thereafter, the non-soluble portion of the photosensitive resin composition film after development may be post-baked depending on necessity, and thus a resist pattern for dry etching is completed. The post-baking is preferably performed at a temperature of 90 to 250° C. for 1 to 60 minutes.

The resist pattern thus produced is excellent in dry etching resistance, can be favorably stripped with water at a temperature of 50° C. or more, and also can be favorably stripped by ashing.

Method for Processing Substrate

The photosensitive resin composition according to the invention may be favorably applied to a method for processing a substrate, containing:

a resin layer forming step of forming a resin layer with the photosensitive resin composition according to the invention on a substrate;

an exposing step of exposing the resin layer positionally selectively;

a developing step of developing the exposed resin layer with water at a temperature less than 50° C., so as to form a resist pattern; and a dry etching step of dry etching the substrate with the resist pattern as a mask.

In the method for processing a substrate, the resin layer forming step, the exposing step, and the developing step are the same as those described above.

The dry etching in the dry etching step is not particularly limited, and examples thereof include dry etching with a plasma (such as oxygen, argon, $CF_4$, and $SF_6$) and corona discharge.

In the dry etching step, the substrate may be divided into small portions through dry etching. By using the method for processing a substrate according to the invention, a substrate, such as a Si substrate, can be diced. Accordingly, a substrate can be diced with less damage than an ordinary physical dicing method.

The method for processing a substrate according to the invention may further contain, after the dry etching step, a stripping step of stripping the resist pattern with water at a temperature of 50° C. or more. The temperature of water used as the stripping solution is 50° C. or more, preferably 60 to 100° C., and more preferably 70 to 90° C.

The method for processing a substrate according to the invention may further contain, after the dry etching step, an ashing step of oxidatively decomposing the resist pattern. The ashing step may be performed immediately after the dry etching step, or may be performed immediately after the stripping step. The ashing may be performed, for example, by using an oxygen plasma. Specifically, the ashing may be performed by using oxygen gas under conditions of a temperature of 40 to 200° C. (center temperature: 100° C.) and a frequency of 13.56 MHz.

EXAMPLES

The invention will be described more specifically with reference to examples below, but the scope of the invention is not construed as being limited to the examples.

Examples 1 and 2 and Comparative Examples 1 and 2

As shown in Table 1 below, (A) a water-soluble resin, (B) a photopolymerizable monomer, (C) a photopolymerization initiator, (D) a UV absorbent, (E) a silane coupling agent, and (F) other components were uniformly mixed in an organic solvent, and diluted with an organic solvent to make a solid content of 20 mass %, thereby providing a photosensitive resin composition. The numerical values in parentheses in Table 1 show the amounts of the components added (unit: part by mass).

The organic solvent used for dilution was a mixed solvent of propylene glycol monomethyl ether acetate and 3-methoxy-3-methyl-1-butanol (mixing ratio: 4/6 by mass).

TABLE 1

|  | (A) | (B) | (C) | (D) | (E) | (F) |
|---|---|---|---|---|---|---|
| Example 1-1 and Example 1-2 | HPC-1 (10) | DPHA (6) | OXE02 (1) | dyeA (0.1) | coupling agent A (0.002) | — |
| Example 2-1 | HPC-2 (10) | DPHA (6) | OXE02 (1) | dyeA (0.1) | coupling agent A (0.002) | — |
| Comparative Example 1 and Comparative Example 1* | acrylic resin (10) | DPHA (6) | OXE02 (1) | dyeA (0.1) | coupling agent A (0.002) | — |

TABLE 1-continued

|  | (A) | (B) | (C) | (D) | (E) | (F) |
|---|---|---|---|---|---|---|
| Comparative Example 2 | HPC-1 (10) | DPHA (6) | OXE02 (1) | dyeA (0.1) | coupling agent A (0.002) | glass powder (40) |

HPC-1: hydroxypropyl cellulose (NISSO HPC SL (available from Nippon Soda Co., Ltd.), Mw: 30,000 to 50,000)
HPC-2: hydroxypropyl cellulose (NISSO HPC SSL (available from Nippon Soda Co., Ltd.), Mw: 15,000 to 30,000)
acrylic resin: acrylic acid/benzyl methacrylate = 20/80 (by mol), Mw: 60,000 (water-insoluble resin (alkali-soluble resin))
DPHA: dipentaerythritol hexaacrylate
OXE02: ethanone, 1-(9-ethyl-6-(2-methylbenzoyl)-9H-carbazol-3-yl), 1-(O-acetyloxime) (IRGACURE OXE02, available from BASF AG)
dye A: 4-(diethylamino)azobenzene
coupling agent A: SILQUEST A-174 SILANE (silane coupling agent, available from Momentive Performance Materials, Inc.)

The resulting photosensitive resin compositions were evaluated for characteristics according to the following methods. The evaluation results are shown in Table 2 below. In the following methods, the etching resistance and the stripping property were evaluated by using a pattern having a film thickness of 6 μm, a line width of 90 μm, and a space width of 30 μm, after the development.

Film Forming Method

The term "spin coating" in the table means that the photosensitive resin composition was spin-coated by dropping on a 6-inch Si wafer. The term "dry film" in the table means that the photosensitive resin composition was coated on a PET film and dried by heating to prepare a dry film, which was then pressed on a 6-inch Si wafer under heating to provide a film.

Resolution Property

The minimum dimension (space pattern) capable of being resolved was measured. A film of the photosensitive resin composition was formed on a 6-inch Si wafer to make a thickness of 10 μm after pre-baking. The film was pre-baked at 80° C. for 5 minutes. Thereafter, the film was subjected to GHI exposure under condition of 60 mJ/cm². After the exposure, PEB (120° C., 5 minutes) was performed, and developed with water at 30° C. for 40 seconds.

Etching Resistance

The etching rates of the Si wafer and the photosensitive resin composition film were measured by exposing to each of the etching gases, and the etching selectivity ratio (((etching rate of Si wafer (μm/sec))/(etching rate of photosensitive resin composition film (μm/sec)))×100) was calculated.

Stripping Property (Warm Water)

The Si wafer having a pattern formed thereon through development in the evaluation of the resolution property was etched with $CF_4$ by using TCE3822 with parallel flat electrodes (available from Tokyo Ohka Kogyo Co., Ltd.) (power: 500 to 2,000 W, 13.56 MHz, substrate temperature: −15° C., pressure: 5 Pa, flow rate: 100 to 500 sccm), and thereby the Si wafer was etched by 100 μm. The resin film after etching was immersed in water at 80° C., and subjected to an ultrasonic washing bath for 10 minutes.

The surface of the substrate after the stripping step was observed with SEM, and the case where the resin film was stripped without any residual material was evaluated as good (A), whereas the case where a residual material was found was evaluated as poor (B).

Stripping Property (Oxygen Plasma)

The Si wafer having a pattern formed thereon through development in the evaluation of the resolution property was etched with $CF_4$ by using TCE3822 with parallel flat electrodes (available from Tokyo Ohka Kogyo Co., Ltd.) (power: 500 to 2,000 W, 13.56 MHz, substrate temperature: −15° C., pressure: 5 Pa, flow rate: 100 to 500 sccm), and thereby the Si wafer was etched by 100 μm. The resin film after etching was ashed with an oxygen plasma. The ashing was performed with TCA3822 with interdigitated transducers (available from Tokyo Ohka Kogyo Co., Ltd.) (temperature: 150° C., power: 1,200 W, time: 10 minutes, pressure: 40 Pa, flow rate: 300 sccm).

The surface of the substrate after the stripping step was observed with SEM, and the case where the resin film was stripped without any residual material was evaluated as good (A), whereas the case where a residual material was found was evaluated as poor (B).

Thermal Decomposition Property

The solid content of the photosensitive resin composition except for the solvent was measured for weight loss by TG-DTA (thermogravimetry-differential thermoanalysis). The case where the weight loss at 400° C. was 85% was evaluated as excellent (AA), the case where the weight loss at 400° C. was 70% or more and less than 85% was evaluated as good (A), and the case where the weight loss at 400° C. was less than 70% was evaluated as poor (B).

TABLE 2

|  | Film forming method | Resolution property | $SF_6$ etching resistance | $CF_4$ etching resistance | Stripping property (warm water) | Stripping property (ashing) | Thermal decomposition property (400° C.) |
|---|---|---|---|---|---|---|---|
| Example 1-1 | spin coating | 15 μm | 100> | 100> | A | A | 90%> |
| Example 1-2 | dry film | 15 μm | 100> | 100> | A | A | 90%> |
| Example 2-1 | spin coating | 15 μm | 85 | 86 | A | A | 90%> |
| Comparative Example 1 | spin coating | not developed | — | — | — | — | 90%> |
| Comparative Example 1* | spin coating | 15 μm | 30 | 25 | B | A | 90%> |
| Comparative Example 2 | spin coating | — | — | — | B | B | 65% |

Comparative Example 1*: The development was performed with a 1 mass % sodium carbonate aqueous solution instead of water.

It is understood from Table 2 that the resist pattern obtained with the photosensitive resin composition for dry etching according to the invention is excellent in all the resolution property, the etching resistance, the stripping property with warm water, the stripping property with an oxygen plasma, and the thermal decomposition property.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for processing a substrate, comprising:
    forming a resin layer with a photosensitive resin composition on a substrate;
    positionally and selectively exposing the resin layer;
    developing the exposed resin layer with water at a temperature less than 50° C., so as to form a resist pattern; and
    dry etching the substrate with the resist pattern as a mask, wherein the photosensitive resin composition contains (A) a water-soluble resin, (B) a photopolymerizable monomer, and (C) a photopolymerization initiator, wherein the photopolymerization initiator (C) is an oxime ester compound.

2. The method according to claim 1, wherein the water-soluble resin (A) contains at least one selected from the group consisting of a cellulose polymer, a vinyl polymer, and an acrylic acid polymer.

3. The method according to claim 1, wherein the photosensitive resin composition has a weight loss at 400° C. of 70% or more.

4. The method according to claim 1, wherein the photosensitive resin composition has an etching selectivity ratio to silicon of 30% or more.

5. The method according to claim 1, wherein the oxime ester compound is a compound represented by the following formula (c1):

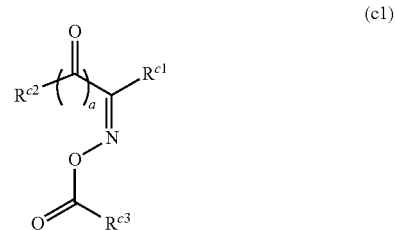

(c1)

wherein $R^{c1}$ represents an alkyl group having 1 to 10 carbon atoms, which may have a substituent, a phenyl group, which may have a substituent, or a carbazolyl group, which may have a substituent; a represents 0 or 1; $R^{c2}$ represents an alkyl group having 1 to 10 carbon atoms, which may have a substituent, a phenyl group, which may have a substituent, or a carbazolyl group, which may have a substituent; and $R^{c3}$ represents a hydrogen atom, an alkyl group having 1 to 6 carbon atoms, or a phenyl group, which may have a substituent.

* * * * *